(12) United States Patent
Kim et al.

(10) Patent No.: US 11,287,554 B2
(45) Date of Patent: Mar. 29, 2022

(54) ELECTRONIC DEVICE

(71) Applicant: Samsung Electronics Co., Ltd., Gyeonggi-do (KR)

(72) Inventors: Min-Sik Kim, Gyeonggi-do (KR); Min-Sung Lee, Gyeonggi-do (KR); Song-Hee Jung, Gyeonggi-do (KR); Seung-Jun Hyun, Seoul (KR); Moo-Young Kim, Seoul (KR); Ki-Huk Lee, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 574 days.

(21) Appl. No.: 16/089,938

(22) PCT Filed: Mar. 29, 2017

(86) PCT No.: PCT/KR2017/003420
§ 371 (c)(1),
(2) Date: Sep. 28, 2018

(87) PCT Pub. No.: WO2017/171400
PCT Pub. Date: Oct. 5, 2017

(65) Prior Publication Data
US 2020/0310008 A1    Oct. 1, 2020

(30) Foreign Application Priority Data

Mar. 31, 2016 (KR) .................. 10-2016-0039112

(51) Int. Cl.
*G02B 5/08* (2006.01)
*F21V 7/00* (2006.01)
(Continued)

(52) U.S. Cl.
CPC .................. *G02B 5/08* (2013.01); *F21V 7/00* (2013.01); *F21V 14/003* (2013.01); *G02B 17/08* (2013.01);
(Continued)

(58) Field of Classification Search
CPC .......... F21V 14/00; F21V 7/00; F21V 14/003; G02B 17/08; G02B 5/08; H05K 5/00;
(Continued)

(56) References Cited

U.S. PATENT DOCUMENTS 3,918,438 A    11/1975   Hayamizu et al.
9,652,082 B1 *  5/2017   Lin ...................... G06F 3/0421
(Continued)

FOREIGN PATENT DOCUMENTS

KR    1020120080443    7/2012
KR    1020130024814    3/2013
(Continued)

OTHER PUBLICATIONS

European Search Report dated Feb. 21, 2019 issued in counterpart application No. 17775824.0-1221, 15 pages.
(Continued)

*Primary Examiner* — Balram T Parbadia
(74) *Attorney, Agent, or Firm* — The Farrell Law Firm, P.C.

(57) ABSTRACT

According to various examples of the present invention, an electronic device can comprise: a housing including a first surface facing a first direction, a second surface facing a second direction opposite to the first direction, and a side surface surrounding at least a part of a space between the first surface and the second surface; a display device formed on at least one of the first surface and the second surface; an opening formed on at least one of the first surface, the second surface, and the side surface; a module mounted inside the housing not to be exposed; and a guide member disposed inside the housing between the module and configured to provide output of the module to outside through the opening. Additionally, the electronic device can be variously implemented according to examples.

11 Claims, 30 Drawing Sheets

(51) Int. Cl.
  *F21V 14/00* (2018.01)
  *G02B 17/08* (2006.01)
  *H05K 5/00* (2006.01)
  *H05K 5/02* (2006.01)

(52) U.S. Cl.
  CPC ......... *H05K 5/0017* (2013.01); *H05K 5/0217* (2013.01)

(58) Field of Classification Search
  CPC ...... H05K 5/02; H05K 5/0017; H05K 5/0217; G06F 1/16; G06F 1/1626; G06F 1/1684; G06F 1/1686; G06F 1/1601; H04M 1/0264; H04M 1/026; H04M 1/02; H04M 1/0202; H04M 2201/38
  See application file for complete search history.

(56) References Cited

U.S. PATENT DOCUMENTS

| | | |
|---|---|---|
| 2009/0196048 A1 | 8/2009 | Kataoka et al. |
| 2010/0066893 A1 | 3/2010 | Tsou |
| 2013/0048837 A1 | 2/2013 | Pope et al. |
| 2013/0094126 A1* | 4/2013 | Rappoport ........... G09G 3/3208 361/679.01 |
| 2014/0092283 A1* | 4/2014 | Yang ................. G02B 26/0841 348/294 |
| 2014/0355227 A1 | 12/2014 | Lim |
| 2015/0253647 A1 | 9/2015 | Mercado |
| 2015/0286457 A1 | 10/2015 | Kim et al. |
| 2016/0178367 A1* | 6/2016 | Tseng ....................... G09G 5/02 250/206 |
| 2016/0234357 A1 | 8/2016 | Yoo et al. |

FOREIGN PATENT DOCUMENTS

| | | |
|---|---|---|
| KR | 1020150033311 | 4/2015 |
| KR | 1020150116218 | 10/2015 |

OTHER PUBLICATIONS

PCT/ISA/210 Search Report issued on PCT/KR2017/003420 (pp. 5).
PCT/ISA/237 Written Opinion issued on PCT/KR2017/003420 (pp. 9).
European Search Report dated Jul. 17, 2019 issued in counterpart application No. 17775824.0-1221, 15 pages.

* cited by examiner (a)

(b)

ELECTRONIC DEVICE

PRIORITY

This application is a National Phase Entry of International Application No. PCT/KR2017/003420, which was filed on Mar. 29, 2017, and claims priority to Korean Patent Application No. 10-2016-0039112, which was filed on Mar. 31, 2016, the contents of each of which are incorporated herein by reference.

TECHNICAL FIELD

Various embodiments of the present disclosure relate to an electronic device, and to an electronic device that makes it possible to secure an ever-narrowing mounting space for modules.

BACKGROUND ART

In an electronic device, a display for displaying a screen and modules for various functions of the electronic device are mounted.

For example, a large sized display is mounted on a front surface of the electronic device and various modules such as a camera module, a main button, a light-emitting module, a receiver module, an illumination sensor, etc., are mounted in a bezel region that is a non-screen region in the periphery of the display.

DETAILED DESCRIPTION OF THE INVENTION

Technical Problem

Recently, a display mounted on an electronic device needs to be full-front mounted on at least one surface of the electronic device, and a bezel region in the periphery of the display tends not to be exposed to the outside of the electronic device in pursuit of elegant design. As the bezel region of the electronic device is designed to be narrowed or even removed, such that a mounting space in the bezel region for mounting modules, e.g., a camera module, an illumination sensor, a light-emitting module, or the like, has been narrowed. That is, a space for mounting modules that have to be exposed to the outside of the electronic device has been gradually narrowed.

While there are restrictions in the size and a need for slimness of the electronic device are needed for portability of the electronic device, a large sized display that displays a screen is still needed for user convenience.

Thus, the present disclosure provides an electronic device in which a mounting space for modules that have to be mounted to be exposed is secured and a structure opened to the outside of the electronic device is also secured.

The present disclosure also provides an electronic device configured to mount a display in a full-front arrangement on the electronic device, thereby providing a user with a wide screen.

Technical Solution

An electronic device according to various embodiments of the present disclosure include a housing including a first surface facing a first direction, a second surface facing a second direction opposite to the first direction, and a side surface surrounding at least a part of a space between the first surface and the second surface, a display device formed on at least one of the first surface and the second surface, an opening formed on at least one of the first surface, the second surface, and the side surface, a module mounted inside the housing not to be exposed, and a guide member arranged between the module and the opening inside the housing and configured to provide output of the module to outside through the opening.

Advantageous Effects

In an electronic device according to various embodiments of the present disclosure, modules that conventionally, have to be exposed to the outside of the electronic device may be mounted inside a housing. Thus, the present disclosure provides a mounting space easily and allows the modules to be connected to the outside through a guide member in a narrow space, such that functions or roles of the modules conventionally mounted to be exposed to the outside may be implemented intactly.

Moreover, in the electronic device according to various embodiments of the present disclosure, the degree of freedom in design may be improved and the design may be made elegant because the modules conventionally exposed to the outside are mounted inside the housing and thus are not exposed to the outside.

Furthermore, in the electronic device according to various embodiments of the present disclosure, a display is full-front mounted on at least one surface of the electronic device, thereby implementing a wide screen and achieving elegant design based on minimization of the bezel region.

\* Description of Symbols

Figure 1A:
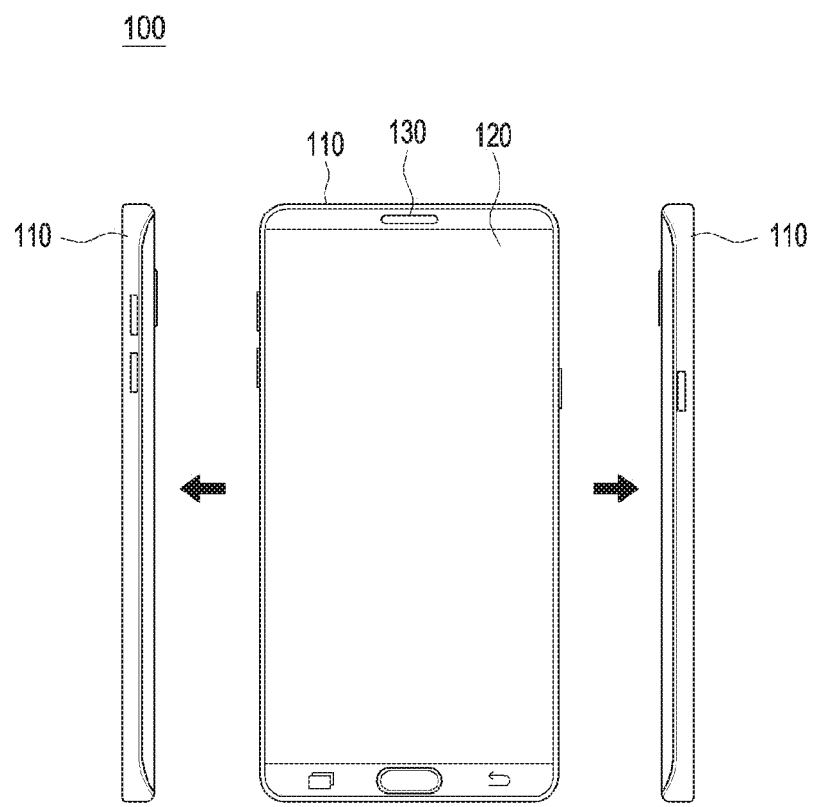
FIG. 1A is a block diagram of an electronic device according to various embodiments of the present disclosure.

| | |
|---|---|
| 100: Electronic Device | 110: Housing |
| 120: Display Device | 130: Module |
| 150: Guide Member | |

MODE FOR CARRYING OUT THE INVENTION

Hereinafter, various embodiments of the present disclosure will be disclosed with reference to the accompanying drawings. However, it should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements.

In the present disclosure, an expression such as "having," "may have," "comprising," or "may comprise" indicates existence of a corresponding characteristic (e.g., a numerical value, a function, an operation, or an element like a part) and does not exclude existence of additional characteristic.

As used herein, each of such phrases as "A or B," "at least one of A or/and B," "at least one or more of A or/and B," and so forth may include all possible combinations of the items enumerated together in a corresponding one of the phrases. For example, "A or B," "at least one of A and B," or "one or more of A or B" may indicate the entire of (1) including at least one A, (2) including at least one B, or (3) including both at least one A and at least one B.

Expressions such as "first," "second," "primarily," or "secondary," used herein may represent various elements regardless of order and/or importance and do not limit corresponding elements. For example, a first user device and a second user device may represent different user devices regardless of order or importance. For example, a first element may be named as a second element without departing from the right scope of the various exemplary embodiments of the present disclosure, and similarly, a second element may be named as a first element.

When it is described that an element (such as a first element) is "operatively or communicatively coupled with/to" or "connected" to another element (such as a second element), the element can be directly connected to the other element or can be connected to the other element through another element (e.g., a third element). However, when it is described that an element (such as a first element) is "directly connected" or "directly coupled" to another element (such as a second element), it means that there is no intermediate element (such as a third element) between the element and the other element.

An expression "configured to (or set)" used in the present disclosure may be replaced with, for example, "suitable for," "having the capacity to," "designed to," "adapted to," "made to," or "capable of" according to a situation. A term "configured to (or set)" does not always mean only "specifically designed to" by hardware. Alternatively, in some situation, an expression "apparatus configured to" may mean that the apparatus "can" operate together with another apparatus or component. For example, a phrase "a processor configured (or set) to perform A, B, and C" may be a dedicated processor (e.g., an embedded processor) for performing a corresponding operation or a generic-purpose processor (such as a central processing unit (CPU) or an application processor) that can perform a corresponding operation by executing at least one software program stored at a memory device. A term "configured to (or set)" does not always mean only "specifically designed to" by hardware.

Terms defined in the present disclosure are used for only describing a specific exemplary embodiment and may not have an intention to limit the scope of other exemplary embodiments. It is to be understood that a singular form of a noun corresponding to an item may include one or more of the things, unless the relevant context clearly indicates otherwise. All of the terms used herein including technical or scientific terms have the same meanings as those generally understood by an ordinary skilled person in the related art. The terms defined in a generally used dictionary should be interpreted as having meanings that are the same as or similar with the contextual meanings of the relevant technology and should not be interpreted as having ideal or exaggerated meanings unless they are clearly defined in the various exemplary embodiments. In some case, terms defined in the present disclosure cannot be analyzed to exclude the present exemplary embodiments.

An electronic device according to various embodiments of the present disclosure may include at least one of, for example, a smartphone, a tablet personal computer (PC), a mobile phone, a video phone, an electronic-book (e-book) reader, a desktop PC, a laptop PC, a netbook computer, a workstation, a server, a personal digital assistant (PDA), a portable multimedia player (PMP), an MP3 player, a mobile medical equipment, a camera, and a wearable device. According to various embodiments, examples of the wearable device may include at least one of an accessory type (e.g., a watch, a ring, a bracelet, an anklet, a necklace, glasses, contact lenses, head-mounted device (HMD), etc.), a fabric or cloth-integrated type (e.g., electronic clothing, etc.), a body-attached type (e.g., a skin pad, a tattoo, etc.), a body implanted type (e.g., an implantable circuit, etc.), and so forth.

According to some embodiments, the electronic device may be a home appliance. The home appliance may include, for example, a television (TV), a Digital Video Disk (DVD) player, audio equipment, a refrigerator, an air conditioner, a vacuum cleaner, an oven, a microwave oven, a laundry machine, an air cleaner, a set-top box, a home automation control panel, a security control panel, a TV box (e.g., HomeSync™ of Samsung, TV™ of Apple, or TV™ of Google), a game console, an electronic dictionary, an electronic key, a camcorder, and an electronic frame.

According to other embodiments of the present disclosure, the electronic device may include at least one of various medical equipment (for example, magnetic resonance angiography (MRA), magnetic resonance imaging (MRI), computed tomography (CT), an imaging device, or an ultrasonic device), a navigation system, a global navigation satellite system (GNSS), an event data recorder (EDR), a flight data recorder (FDR), a vehicle infotainment device, electronic equipment for ships (e.g., a navigation system and gyro compass for ships), avionics, a security device, a vehicle head unit, an industrial or home robot, an automatic teller's machine (ATM), a point of sales (POS), Internet of things (e.g., electric bulbs, various sensors, electricity or gas meters, sprinkler devices, fire alarm devices, thermostats, streetlights, toasters, exercise machines, hot-water tanks, heaters, boilers, and so forth).

According to some embodiments, the electronic device may include a part of a furniture or building/structure, an electronic board, an electronic signature receiving device, a projector, and various measuring instruments (e.g., a water, electricity, gas, electric wave measuring device, etc.). The electronic device according to various embodiments of the present disclosure may be one of the above-listed devices or a combination thereof. The electronic device according to some embodiments may be a flexible electronic device. The electronic device according to various embodiments of the present disclosure is not limited to the above-listed devices and may include new electronic devices according to technical development.

Figure 1B:
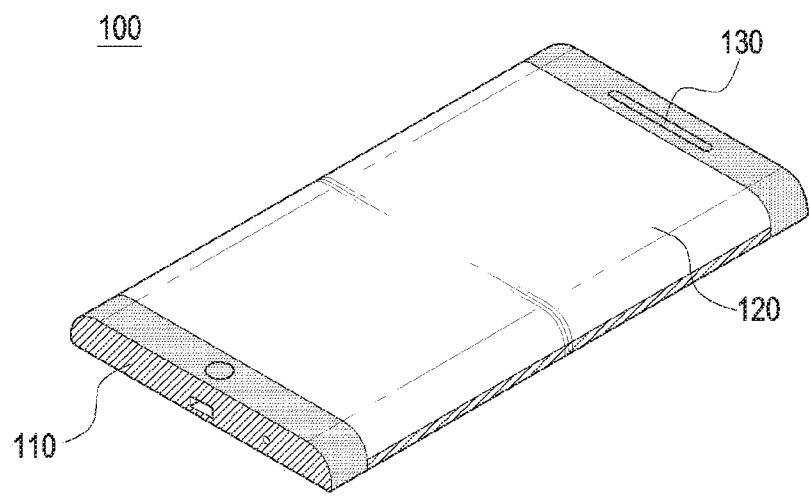
FIG. 1B is a perspective view of another electronic device according to various embodiments of the present disclosure.

FIG. 1A is a block diagram of an electronic device 100 according to various embodiments of the present disclosure. FIG. 1B is a perspective view of another electronic device 100 according to various embodiments of the present disclosure.

Referring to FIGS. 1A and 1B, the electronic device 100 may include a housing 110 and a display device (hereinafter, referred to as 'a display 120') that outputs a screen on at least one surface of the housing 110 and implements an input based on contact or proximity The housing 110 according to an embodiment may include a first surface, a second surface, and a side surface.

In the housing 110 of the electronic device, the first surface is facing a first direction, the second surface is facing a second direction opposite to the first direction, and the side surface surrounds at least a part of a space between the first surface and the second surface.

On at least one of the first surface or the second surface of the housing 110 according to an embodiment is provided the display 120 for displaying a screen, and on a surface opposing the at least one surface are provided a battery for supplying power to the electronic device and a rear case for covering the battery. A front surface on which the display 120 is mounted will be described as the first surface of the electronic device 100 according to various embodiments of the present disclosure, and a rear surface on which the battery is mounted will be described as the second surface of the electronic device 100.

Inside the first surface, the second surface, or the side surface of the external housing 110, more specifically, inside the housing 110, various modules 130, e.g., a camera device, a speaker device, a light-emitting device, an input device, etc., may be arranged, and a connector for connecting the electronic device with an external device may also be provided, and an antenna module, a battery, and so forth may be arranged inside the internal housing 110.

The display 120 is arranged on at least one of the first surface and the second surface, and the display 120 implements an input based on contact or proximity of an object and displays an image based on a user environment. The display 120 is arranged in at least one surface of the housing 110 in which a touch panel and a display panel for displaying a screen on a surface of the touch panel are stacked.

The display 120 displays an input and an output corresponding thereto through an object having electric charges like a hand or the module 130 such as a digitizer pen or a stylus pen. The display 120 according to various embodiments of the present disclosure may receive an input of continuous movement of one of at least one contact. In various embodiments of the present disclosure, 'contact' may include not only direct contact of a user's body part or the module 130 such as a stylus pen, but also non-contact, for example, proximity, in the display 120 or a separate input device implementing a touch-type input. A detectable distance on the display 120 may vary depending on performance or structure of the electronic device 100.

The opening 101 according to an embodiment may be formed on at least one of the first surface, the second surface, and the side surface of the housing 110. The opening 101 according to various embodiments of the present disclosure may utilize a tolerance generated in coupling between the housing 110 and the display 120, or may be provided to be separately connected with the module 130 in a peripheral circumference or the side surface of the display 120 or on a surface that is different from the surface where the display 120 is mounted. The opening 101 according to an embodiment of the present disclosure may be formed to a smaller size than the size of the opening 101 for exposing or opening the module 130 in a conventional case.

The module 130 according to an embodiment is mounted not to be exposed inside the housing 110. For example, the module 130 exposed to the outside of the housing 110 in a conventional case may be mounted inside the housing 110. More specifically, the module 130 is mounted in adjacent to the opening 101 on a space between the housing 110 and the display 120, and is provided to be driven through the opening 101 and a guide member 150 described below, as if the module 130 is mounted to be exposed to the outside.

The module 130 according to an embodiment may include at least one of the light-emitting module 130, the illumination sensor module 130 for receiving external light, the imaging module 130 such as a camera, the screen module 130 capable of securing an additional screen in connection to or in adjacent to a part of the display 120, and the detection module 130 capable of detecting proximity The guide member 150 according to an embodiment may be arranged inside the housing 110 between the module 130 and the opening 101. The guide member 150 guides driving of the non-opened module 130, which is mounted inside the housing 110 on a rear surface of the display 120, to be output to the outside through the opening 101.

Figure 2:
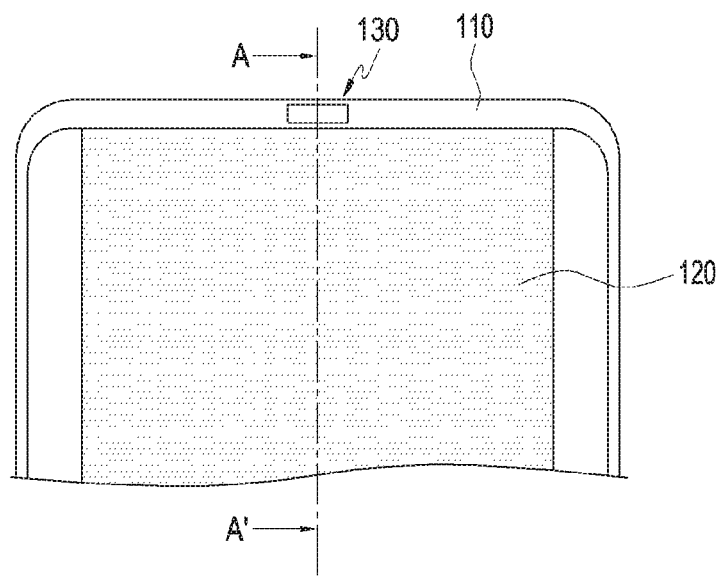
FIG. 2 illustrates a part of an electronic device in which an opening for a module is mounted in the electronic device according to various embodiments of the present disclosure.

FIG. 2 illustrates a part of the electronic device 100 in which the opening 101 for the module 130 is mounted in the electronic device 100 according to various embodiments of the present disclosure.

Figure 3:
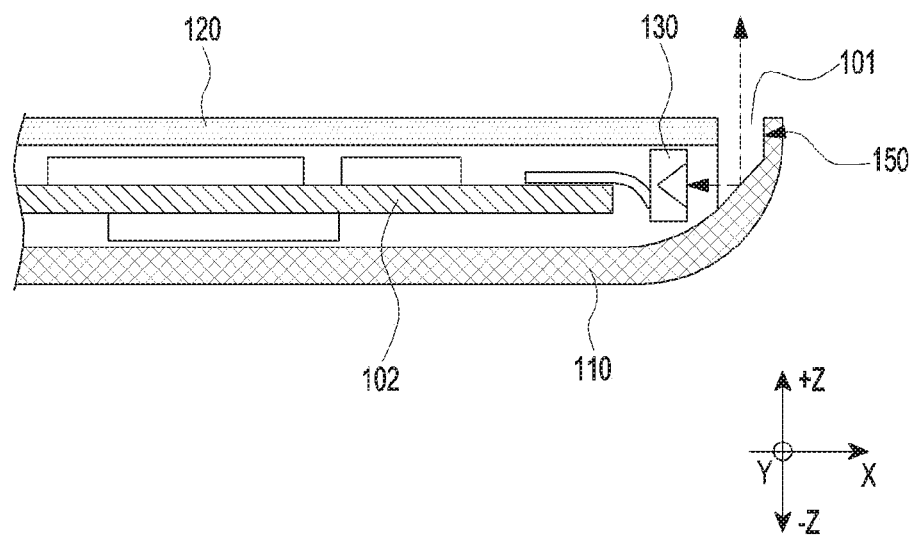
FIG. 3 is a cross-sectional view illustrating a part of an electronic device in which a module and an opening for the module are mounted in the electronic device according to various embodiments of the present disclosure.

FIG. 3 is a cross-sectional view illustrating a part of the electronic device 100 in which the module 130 and the opening 101 for the module 130 are mounted in the electronic device 100 according to various embodiments of the present disclosure.

Referring to FIGS. 2 and 3, the module 130 is arranged on the rear surface of the display 120 and inside the housing 110.

First, the module 130 according to an embodiment may be the light-emitting module 130. The module 130 may be mounted on the rear surface of the display 120 and inside the housing 110.

When the module 130 is the light-emitting module 130, the guide member 150 receives light emitted from the light-emitting module 130 and emits the light toward the opening 101. As the light-emitting module 130 emits the light in a first direction (an X-axis direction in the present disclosure) of the electronic device 100 and the opening 101 is arranged in a second direction (a Z-axis direction in the present disclosure) perpendicular to the first direction (the X-axis direction), the guide member 150 is formed inclinedly inside the housing 110 to guide in the second direction (the Z-axis direction), the light emitted from the light-emitting module 130 in the first direction (the X-axis direction). The guide member 150 according to an embodiment may include at least one of a reflective member such as a mirror or a light-guiding member such as a waveguide.

Figure 4:
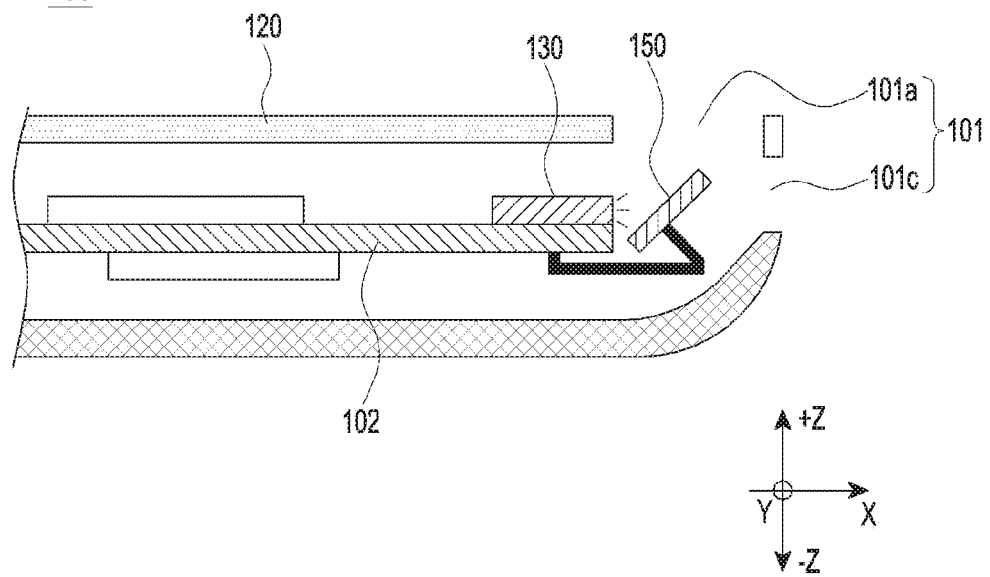
FIG. 4 is a cross-sectional view illustrating a part of an electronic device in which a module and an opening for the module are mounted in the electronic device according to various embodiments of the present disclosure.
Figure 5:
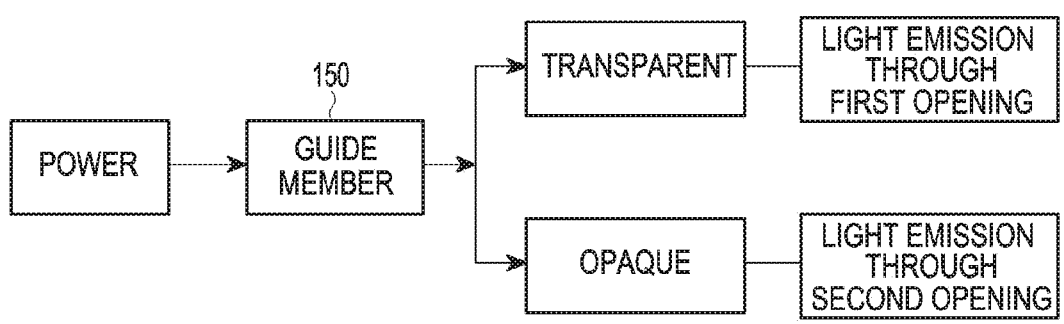
FIG. 5 is a block diagram showing an output of a module based on a setting mode in an electronic device according to various embodiments of the present disclosure.
Figure 6:
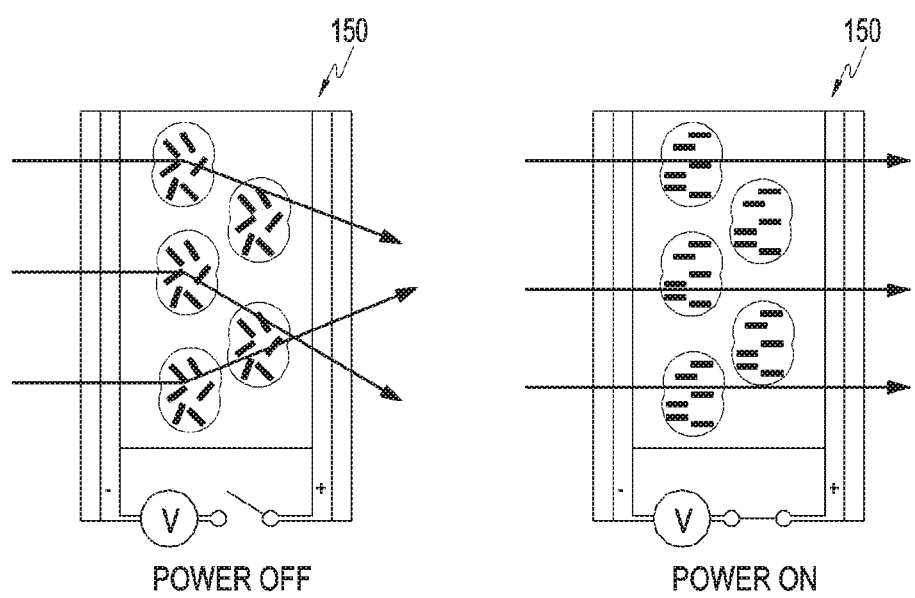
FIG. 6 illustrates a change process of a guide member based on a setting mode in an electronic device according to various embodiments of the present disclosure.

FIG. 4 is a cross-sectional view illustrating a part of the electronic device 100 in which the module 130 and the opening 101 for the module 130 are mounted in the electronic device 100 according to various embodiments of the present disclosure. FIG. 5 is a block diagram showing an output of the module 130 based on a set mode in the electronic device 100 according to various embodiments of the present disclosure. FIG. 6 illustrates a change process of the guide member 150 based on a set mode in the electronic device 100 according to various embodiments of the present disclosure.

Referring to FIGS. 4 to 6, in the previous embodiment, a structure for outputting the light emitted from the light-emitting module 130 through one opening 101 is provided, but the opening 101 according to an embodiment of the present disclosure may have a structure for outputting the light emitted from the light-emitting module 130 through at least two surfaces.

The opening 101 according to an embodiment may include a first opening 101a and a second opening 101b.

The first opening 101a is provided between the housing 110 and the display 120, and the second opening 101b is provided on the side surface of the housing 110, which is adjacent to the light-emitting module 130.

The first opening 101a is positioned in the second direction (the Z-axis direction) that is perpendicular to the output direction of the light emitted from the light-emitting module 130, and the second opening 101b is positioned in the first direction (the X-axis direction) that is the same as the output direction of the light emitted from the light-emitting module 130.

In this case, the guide member 150 is provided to output the light emitted from the light-emitting module 130 in the first direction (the X-axis direction) or the second direction (the Z-axis direction).

For example, the guide member 150 may be electrically connected with a substrate part 102 of the housing 110 and may be provided to change between transparency and opacity depending on application of power thereto or switching of setting. That is, when the power is not applied to the guide member 150, the guide member 150 may change to be opaque to accurately reflect light like a mirror. Unlike the mirror, the guide member 150 may cause diffusion to reflect light in an arbitrary direction.

For example, when light, emitted from the light-emitting module 130 in the first direction (the X-axis direction), is output in the second direction (the Z-axis direction), the guide member 150, if provided as the mirror, may cause the light emitted from the light-emitting module 130 to be accurately reflected in the second direction (the Z-axis direction). On the other hand, when the guide member 150 is provided to cause diffusion, the guide member 150 may cause the light emitted from the light-emitting module 130 in the first direction (the X-axis direction) to be diffused in the second direction (the Z-axis direction).

When the power is applied to the guide member 150, the guide member 150 changes to be transparent so as to pass the light therethrough.

Thus, when the power is not applied to the guide member 150, the guide member 150 may cause the light emitted from the light-emitting module 130 in the first direction (the X-axis direction) to be reflected in the second direction (the Z-axis direction) and thus to be output toward the first opening 101a. On the other hand, when the power is not applied to the guide member 150, the guide member 150 may cause the light emitted from the light-emitting module 130 in the first direction (the X-axis direction) to be output in the first direction (the X-axis direction) by passing the light therethrough and then to be output toward the second opening 101b in the first direction (the X-axis direction).

Figure 7:
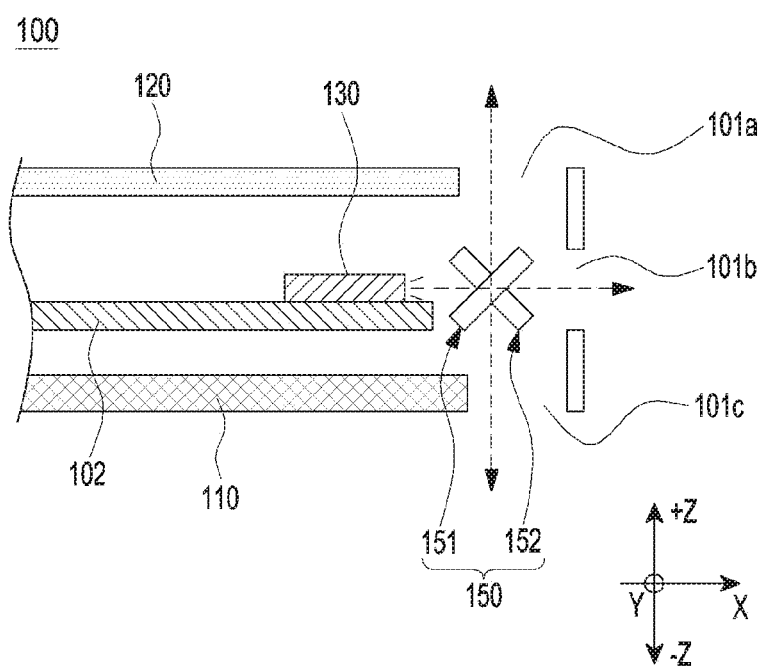
FIG. 7 is a cross-sectional view illustrating a part of an electronic device in which a module and an opening for the module are mounted in the electronic device according to various embodiments of the present disclosure.
Figure 8:
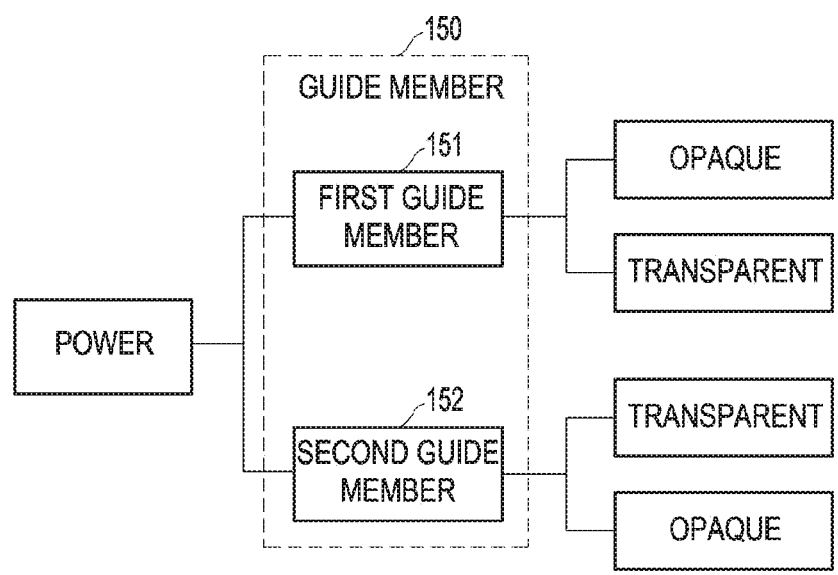
FIG. 8 is a block diagram showing an output of a module based on a setting mode in an electronic device according to various embodiments of the present disclosure.

FIG. 7 is a cross-sectional view illustrating a part of the electronic device 100 in which the module 130 and the opening 101 for the module 130 are mounted in the electronic device 100 according to various embodiments of the present disclosure. FIG. 8 is a block diagram showing an output of the module 130 based on a set mode in the electronic device 100 according to various embodiments of the present disclosure.

Referring to FIGS. 7 to 8, in the previous embodiment, a structure for outputting the light emitted from the light-emitting module 130 through one opening 101 or two openings 101 is provided, but the opening 101 according to an embodiment of the present disclosure may have a structure for outputting the light emitted from the light-emitting module 130 through three surfaces.

The opening 101 according to an embodiment may include the first opening 101a, the second opening 101b, and a third opening 101c.

The first opening 101a is provided between the housing 110 and the display device 120, the second opening 101b is provided on the side surface of the housing 110 that is adjacent to the light-emitting module 130, and the third opening 101c is provided in a surface of the housing 110 that opposes the first opening 101a, for example, in the second surface of the housing 110 if the first opening 101a is provided in the first surface of the housing 110.

The first opening 101a is positioned in the second direction (a +Z-axis direction) that is perpendicular to the output direction of the light emitted from the light-emitting module 130, the second opening 101b is positioned in the first direction (the X-axis direction) that is the same as the output direction of the light emitted from the light-emitting module 130, and the third opening 101c is positioned in a third direction (a −Z-axis direction) that is perpendicular to the output direction of the light emitted from the light-emitting module 130.

The guide member 150 is provided to output the light emitted from the light-emitting module 130 in the first direction (the X-axis direction), the second direction (the +Z-axis direction), or the third direction (the −Z-axis direction).

For example, the guide member 150 may be electrically connected with the substrate part 102 and may be provided to change between transparency and opacity depending on application of power thereto or switching of setting. More specifically, the guide member 150 may include a first guide member 151 capable of reflecting light in the first direction (the X-axis direction) and a second guide member 152 capable of reflecting light in the second direction (the +Z-axis direction). For example, to output the light emitted from the light-emitting module 130 through the first opening 101a, the first guide member 151 may change to be opaque by non-application of the power thereto and the second guide member 152 may change to be transparent by application of the power thereto. Consequently, the light emitted from the light-emitting module 130 may be output through the first opening 101a by being reflected by the first guide member 151 in the second direction (the +Z-axis direction). On the other hand, to output the light emitted from the light-emitting module 130 through the second opening 101b, the first guide member 151 and the second guide member 152 may change to be transparent by application of the power thereto, such that the light emitted from the light-emitting module 130 in the first direction (the X-axis direction) may be output through the second opening 101b by passing through the transparent first guide member 151 and second guide member 152. To output the light emitted from the light-emitting module 130 through the third opening 101c, the first guide member 151 may change to be transparent by application of the power thereto and the second guide member 152 may change to be opaque by non-application of the power thereto. The light emitted from the light-emitting module 130 in the first direction (the X-axis direction) may be output through the third opening 101c by being reflected by the second guide member 152 in the third direction (the −Z-axis direction).

Figure 9:
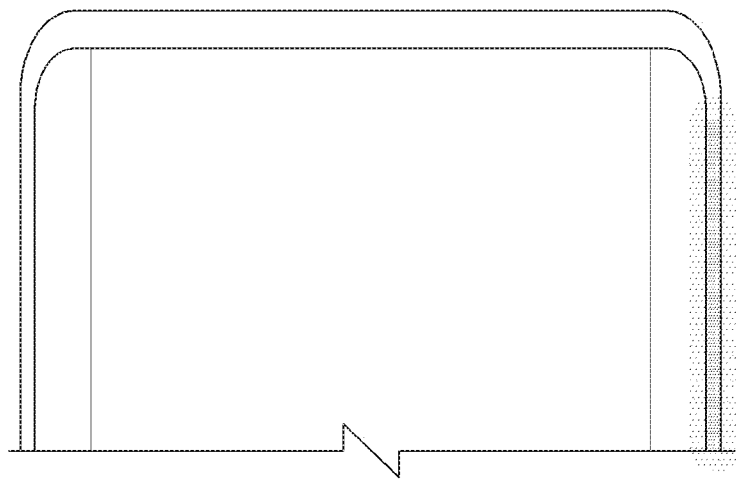
FIG. 9 illustrates a driving state of a module in an electronic device according to various embodiments of the present disclosure.

FIG. 9 illustrates a driving state of the module 130 in the electronic device 100 according to various embodiments of the present disclosure.

Referring to FIG. 9, the opening 101 may be provided in a part of a peripheral circumference of the display 120 or in the entire edge or a predetermined length thereof along the circumference of the display 120. The light-emitting module 130 is mounted along the peripheral circumference of the display 120 and inside a lower portion of the display 120, and the guide member 150 is arranged along the opening 101 between coupling surfaces of the display 120 and the housing 110. Thus, the light emitted from the light-emitting module 130 is output along the edge of the first surface or the second surface, or along the circumference of the side surface.

As mentioned above, the opening 101 may include the first opening 101a formed along the periphery of the display 120 in the first surface and the second opening 101b formed along the side surface depending on a structure thereof, and the light may be output in the direction of the first surface of the housing 110 or the side surface of the housing 110 depending on electrical application to the guide member 150.

As mentioned before, the opening 101 may include the first opening 101a formed along the periphery of the display 120 in the first surface, the second opening 101b formed along the side surface, and the third opening 101c formed along the edge of the first surface depending on a structure thereof, and the guide member 150 may include the first guide member 151 and the second guide member 152 to reflect light in the first direction (the X-axis direction, see FIG. 7), the second direction (the +Z-axis direction, see FIG. 7), or the third direction (the −Z-axis direction, see FIG. 7) depending on a situation. To output the light emitted from the light-emitting module 130 through the first opening 101a formed along the edge of the first surface, the first guide member 151 may change to be opaque by non-application of the power thereto and the second guide member 152 may change to be transparent by application of the power thereto. Consequently, the light emitted from the light-emitting module 130 may be output through the first opening 101a by being reflected by the first guide member 151 in the second direction (the Z-axis direction). On the other hand, to output the light emitted from the light-emitting module 130 through the second opening 101b formed along the side surface, the first guide member 151 and the second guide member 152 may change to be transparent by application of the power thereto, such that the light emitted from the light-emitting module 130 in the first direction (the X-axis direction) may be output through the second opening 101b by passing through the transparent first guide member 151 and second guide member 152. To output the light emitted from the light-emitting module 130 through the third opening 101c formed along the edge of the second surface, the first guide member 151 may change to be transparent by application of the power thereto and the second guide member 152 may change to be opaque by non-application of the power thereto. Thus, the light emitted from the light-emitting module 130 in the first direction (the X-axis direction) may be output through the third opening 101c by being reflected by the second guide member 152 in the third direction.

Figure 10A:
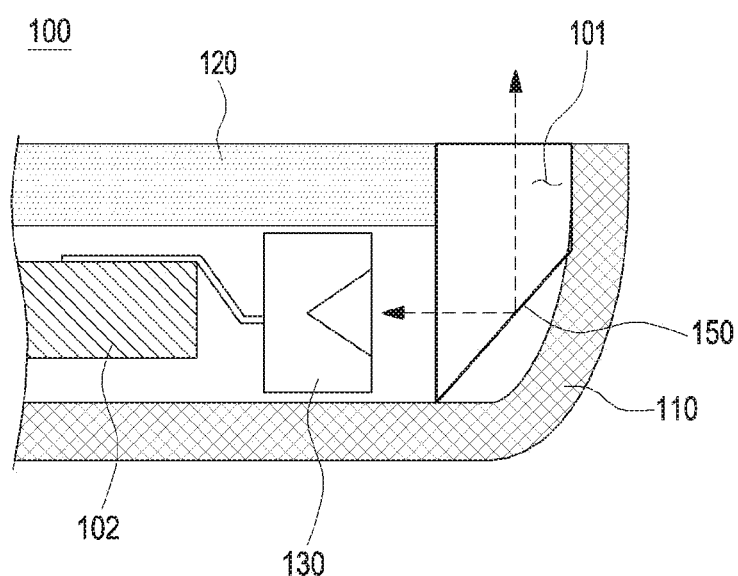
FIGS. 10A through 10C illustrate various shapes of a guide member in an electronic device according to various embodiments of the present disclosure.
Figure 10B:
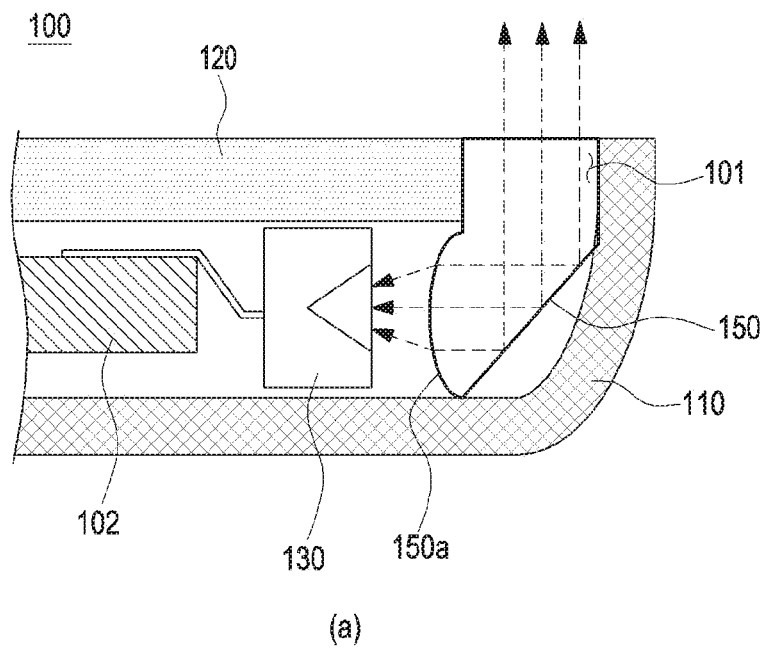
Figure 10B:
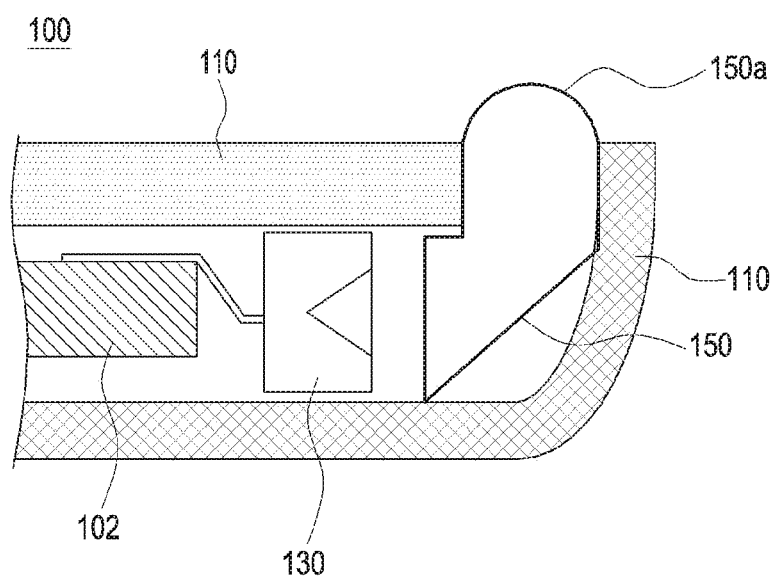
Figure 10C:
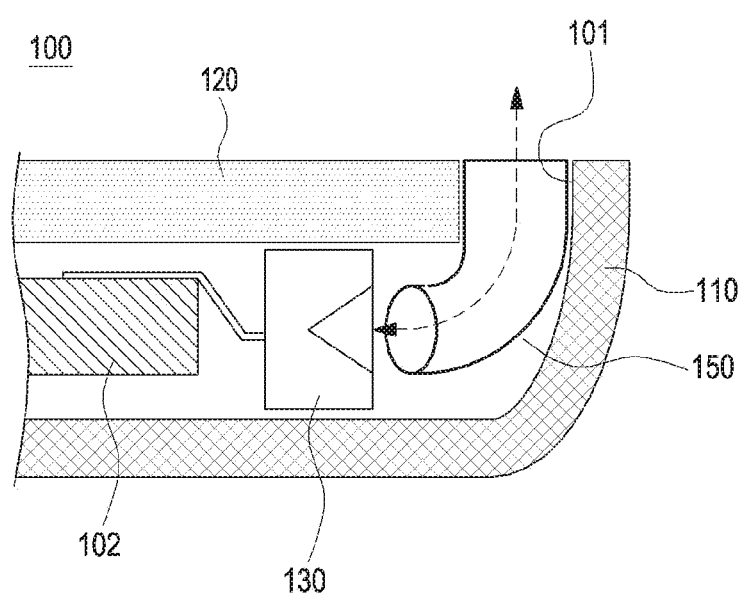

FIGS. 10A through 10C illustrate various shapes of the guide member 150 in the electronic device 100 according to various embodiments of the present disclosure.

Referring to FIGS. 10A through 10C, the guide member 150 may have various materials and shapes as mentioned before, and for example, may have a reflective member like a reflection mirror or a light-guiding member like a waveguide, and the guide member 150 may include a lens part 150a for collecting light emitted from the light-emitting module 130 or emitting received light.

The lens part 150a may be mounted at a side of the module 130 or at a side of the opening 101, or at both of them. For example, the module 130 may be a module for delivering an optical signal, for example, an optical sensor module such as a light-emitting module or an infrared (IR) sensor module. If the module 130 is a light-emitting module, when the lens part 150a is mounted at a side of the light-emitting module 130, light emitted from the light-emitting module 130 may be collected by the lens part 150a and is led into the guide member 150; when the lens part 150a is mounted at a side of the opening 101, then the light emitted from the light-emitting module 130 may double an output.

The guide member 150 may include a guide housing that connects from the side of the opening 101 to the module 130 and collects sound or light of the module 130, or outputs received light. That is, the guide housing leads in the light emitted from the light-emitting module 130, reflects the emitted light toward the opening 101, and outputs the light to the opening 101. The guide housing may also include a reflection surface for delivering a signal to the module.

Hereinbelow, a description will be made of a case where the module 130 is mounted together with another module 130 and of a corresponding structure of the guide member 150, by taking an example.

Figure 11A:
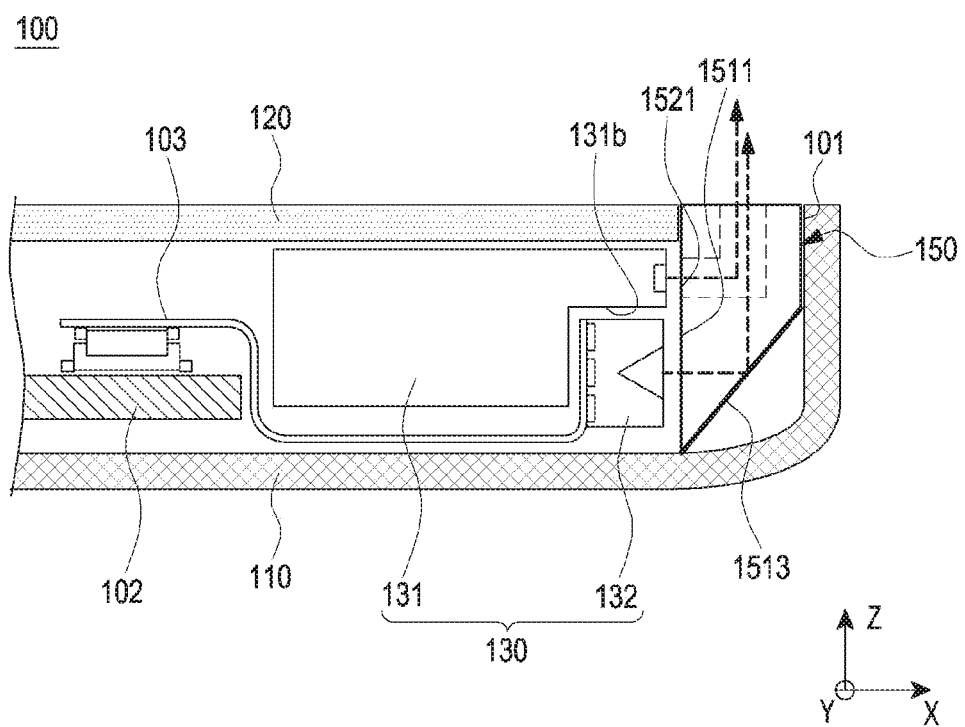
FIG. 11A illustrates a structure having two different modules mounted together therein and a structure of a corresponding guide member in an electronic device according to various embodiments of the present disclosure.

FIG. 11A illustrates a structure having two different modules 130 mounted together therein and a structure of the corresponding guide member 150 in the electronic device 100 according to various embodiments of the present disclosure. FIG. 10B illustrates the guide member 150 in the electronic device 100 according to various embodiments of the present disclosure.

Figure 11B:
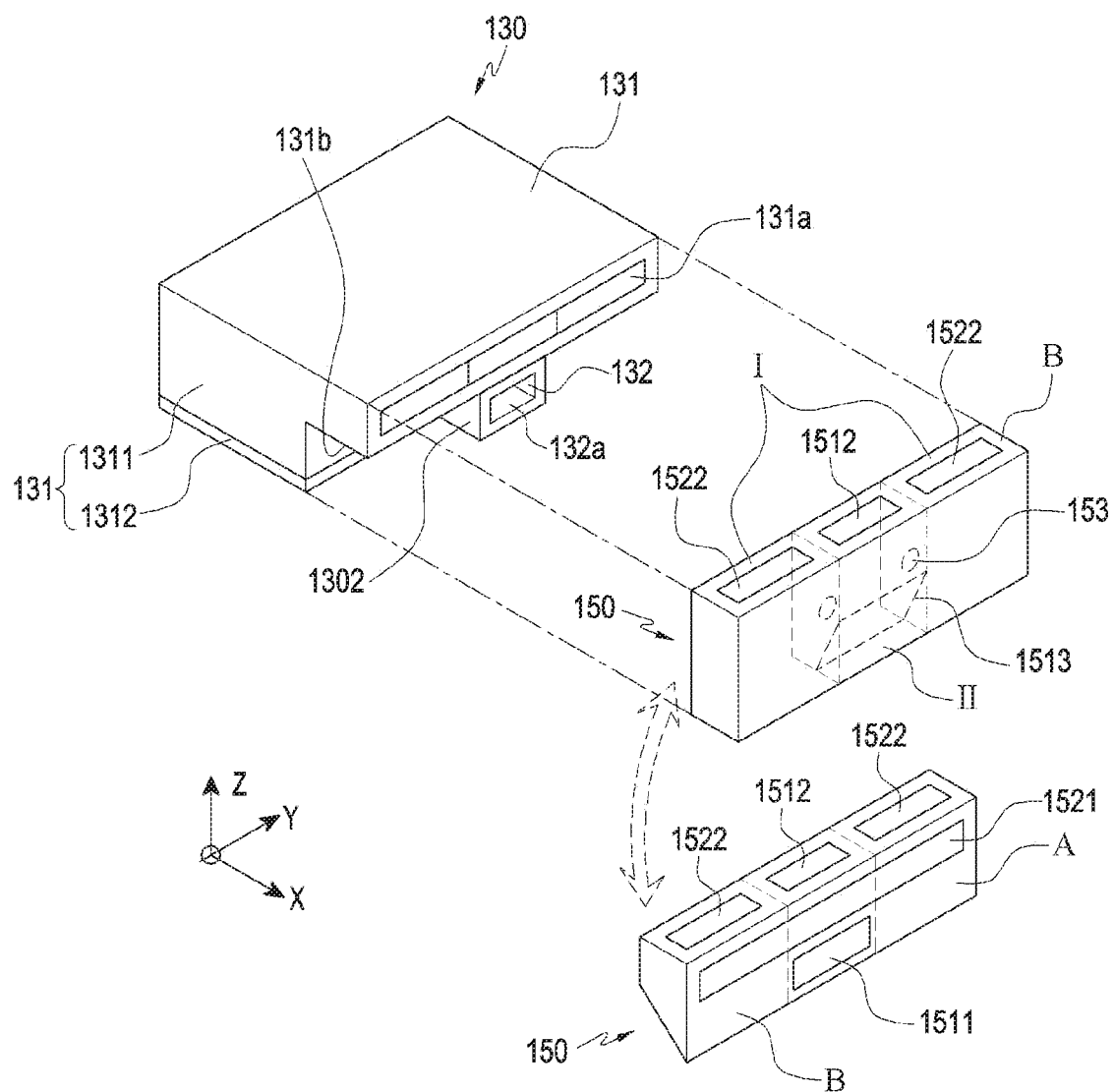
FIG. 11B illustrates a guide member in an electronic device according to various embodiments of the present disclosure.

Referring to FIGS. 11A and 11B, the various modules 130 are mounted in the electronic device 100. For example, a sound module 131 for inputting or outputting a sound signal and an optical signal module 132 such as an IR sensor or a light-emitting member may be provided inside the housing 110, in which the optical signal module 132 may be arranged by sharing a part of a mounting space of the sound module 131 with the sound module 131.

More specifically, the sound module 131 and the optical signal module 132 may be arranged on the rear surface of the display 120 provided on at least one surface of the housing 110. Moreover, there may be various embodiments for the arrangement position of the optical signal module 132, and the optical signal module 132 according to an embodiment may be arranged by sharing a part of the space of the sound module 131 with the sound module 131.

The sound module 131 may be a receiver module that may include a piezo speaker 1312 for inputting or outputting sound and a resonant member 1311 forming a resonant space for sound of the piezo speaker 1312. The optical signal module 132 may be provided by sharing a part of the mounting space of the sound module 131 with the sound module 131. For example, a stepped lead-in groove 131b may be formed in a rear surface of an end of the resonant member 1311, and the optical signal module 132 may be mounted to be placed in the lead-in groove 131b. As the optical signal module 132 is arranged in the lead-in groove 131b of the sound module 131, the optical signal module 132 may be centered on the rear surface of the sound module 131.

The guide member 150 may be provided to input or/and output a signal, i.e., sound, of the sound module 131 and the optical signal module 132 that are arranged on the rear surface of the display 120 and to input or/and output light to or/and from the optical signal module 132.

The guide member 150 according to an embodiment may also be provided to deliver a signal to the sound module 131 and the optical signal module 132 that are arranged to output or lead a signal in, which is led in or is output in a second direction (the Z-axis direction), in a first direction (the X-axis direction) that is bent perpendicularly to the second direction (the Z-axis direction).

The optical signal module 132 according to the present disclosure will be described by taking an example of the light-emitting module 130 that emits light, such that the optical signal module 132 may include a light outlet 132a for discharging light in the first direction (the X-axis direction). However, when the optical signal module 132 receives light, for example, when the optical signal module 132 is an illumination sensor, the optical signal module 132 may include a light inlet for introducing light in the first direction (the X-axis direction). The sound module 131 will be described by taking an example of the receiver module 130, such that the resonant module 1311 may include a sound outlet 131a for discharging sound in the first direction (the X-axis direction). However, when the sound module 131 receives a sound signal, for example, when the sound module 131 is a microphone member, the sound module 131 may include a sound inlet for introducing a sound signal in the first direction (the X-axis direction).

The guide member 150 according to an embodiment may output in the second direction (the Z-axis direction), light and sound output in the first direction (the X-axis direction). The guide member 150 may include a surface for receiving light and sound (hereinafter, referred to as an "input surface A") and a surface for outputting light and sound (hereinafter, referred to as an "output surface B").

The output surface B is arranged in the opening 101, and the input surface A is arranged in adjacent to the sound module 131 and the optical signal module 132.

The guide member 150 is divided into a light guide section II provided to input or output an optical signal of the optical signal module 132 and a sound guide section I provided to input or output a sound signal of the sound module 131. The light guide section II is connected with the sound guide section I, such that sound may be output through the light guide section II.

The light guide section II according to an embodiment may be arranged between the sound guide sections I. The light guide section II may include a first light opening 1511 formed on the input surface A to receive light emitted in the first direction (the X-axis direction) through the light outlet 132a of the optical signal module 132, a second light opening 1512 formed on the output surface B to output an optical signal delivered to the first light opening in the second direction (the Z-axis direction), and a reflective member 1513, such as a mirror, or an inclined reflection surface (hereinafter, also referred to as the "reflective member 1513") to switch light input in the first direction (the X-axis direction) to the second direction (the Z-axis direction) or an inclined reflection surface.

The sound guide sections I may be arranged on both sides of the light guide section II, and the sound guide section I may include a first sound opening 1521 formed in the input surface A to receive a sound signal output in the first direction (the X-axis direction) through the sound outlet 131a of the sound module 131 and a second sound opening 1522 formed in the output surface B to discharge the sound signal delivered to the first sound opening 1521 in the second direction (the Z-axis direction).

The first light opening 1511 and the first sound opening 1521 are arranged in the input surface A in which the first light opening 1511 is arranged between the first sound openings 1521, and the second light opening 1512 and the second sound opening 1522 are arranged in the output surface B in which the second light opening 1512 is arranged between the second sound openings 1522. As the optical signal module 132 is arranged on a rear surface of the resonant member 1311, the first light opening 1511 may be formed in a lower position than the first sound opening 1521 in the input surface A.

Referring to a mounting structure of the housing 110 in which the optical signal module 132 is placed on the rear surface of the sound module 131, the sound module 131 arranged on the rear surface of the optical signal module 132 is arranged on the rear surface of the display 120 such that the sound module 131 and the optical signal module 132 are not exposed to the outside, and the guide member 150 is placed inside the opening 101 such that the input surface A of the guide member 150 is provided to face a surface where the first sound opening 1521 and the first light opening 1511 are formed and the output surface B of the guide member 150 is exposed through the opening 101.

Thus, the first sound opening 1521 is connected with the sound module 131, specifically, the sound outlet 131a, receives a sound signal generated in the sound module 131, and outputs the sound signal through the second sound opening 1522 exposed to the opening 101. The first sound opening 1511 may also be connected with the optical signal module 132, specifically, the light outlet 132a, receives a light or optical signal generated in the optical signal module 132, and outputs the light signal through the second light opening 1512 exposed to the opening 101.

In portions of both sides of the light guide section II, which are adjacent to the sound guide section I, connection holes 153 for operating with the sound guide sections I arranged on the both sides of the light guide section II may be further formed.

The light guide section II may be provided to input or output light through the light guide section II, and sound generated in the sound guide section I is introduced to the light guide section II through the connection holes 153 and is output through the light guide section II, specifically, the second light opening 1512.

Thus, the light signal is output or input through the light guide section II, and the sound signal is input or output through the sound guide section I, and when the connection holes 153 are formed, the sound signal may also be output through the light guide section II.

Figure 12A:
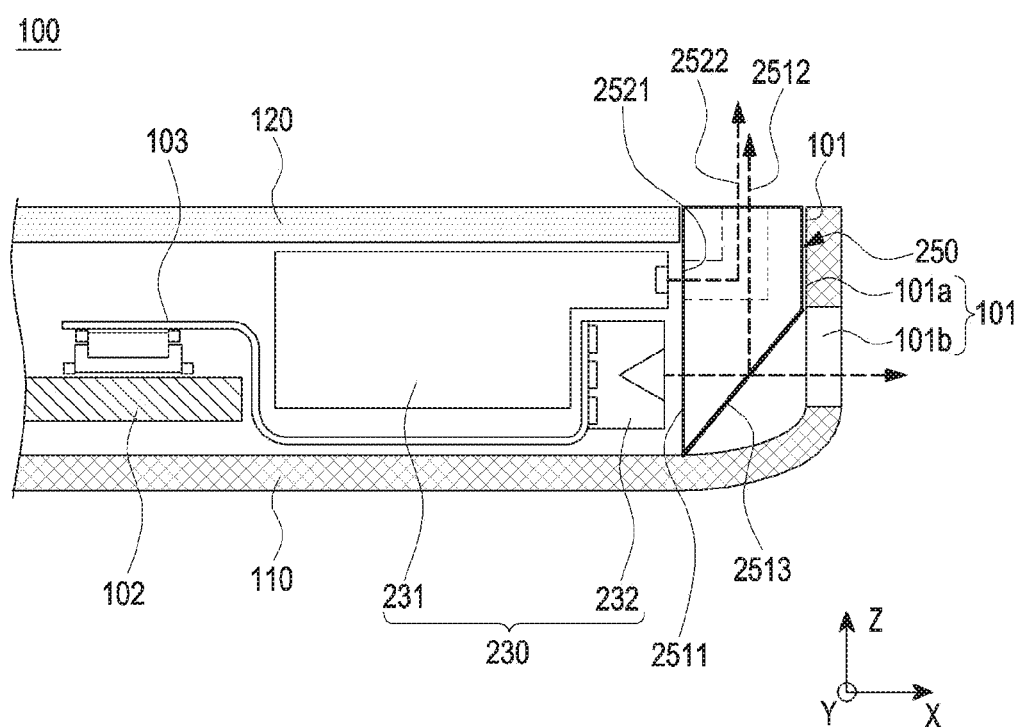
FIG. 12A illustrates a structure having two different modules mounted together therein and a structure of a corresponding guide member in an electronic device according to various embodiments of the present disclosure.
Figure 12B:
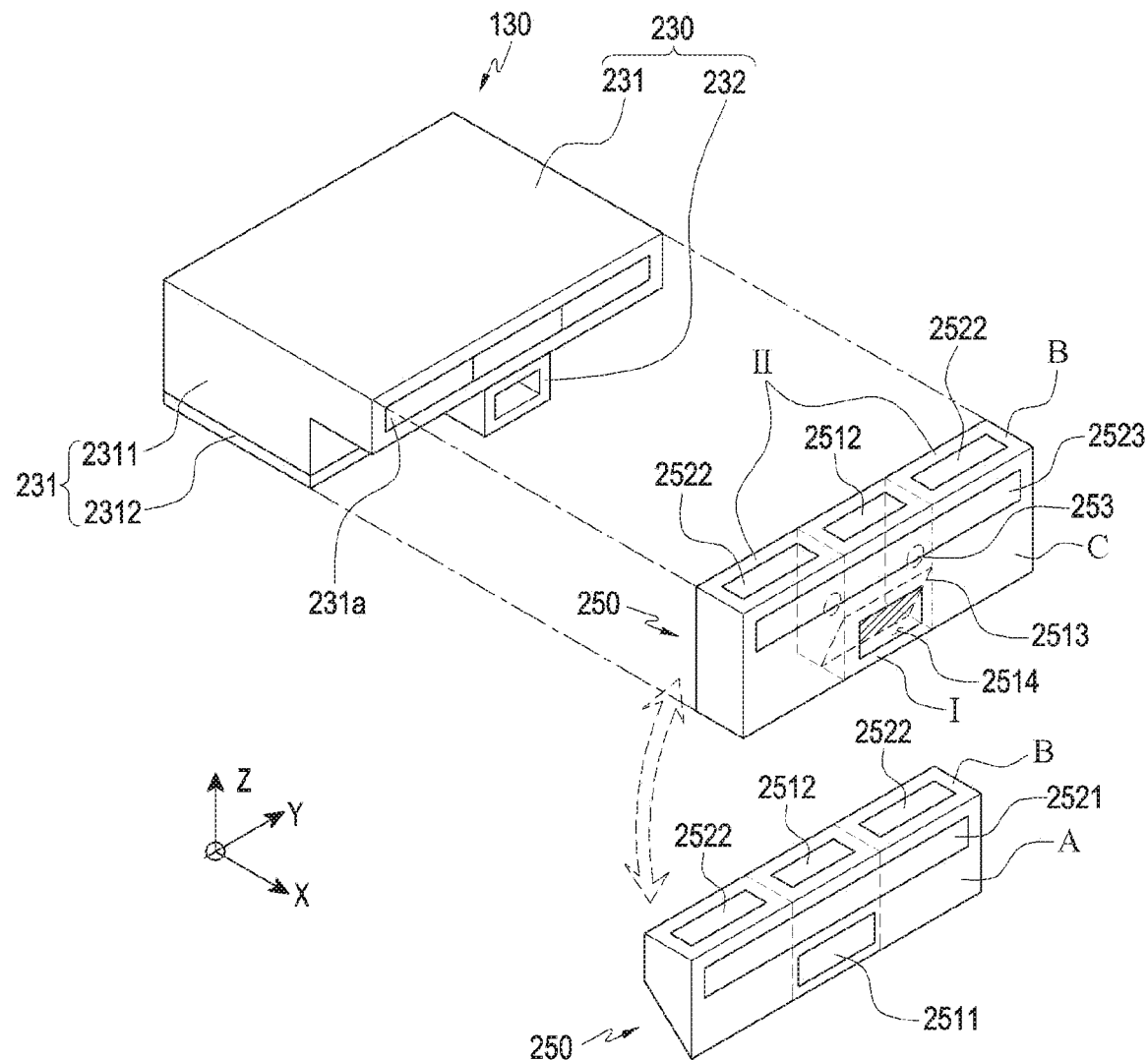
FIG. 12B illustrates a guide member in an electronic device according to various embodiments of the present disclosure.
Figure 12C:
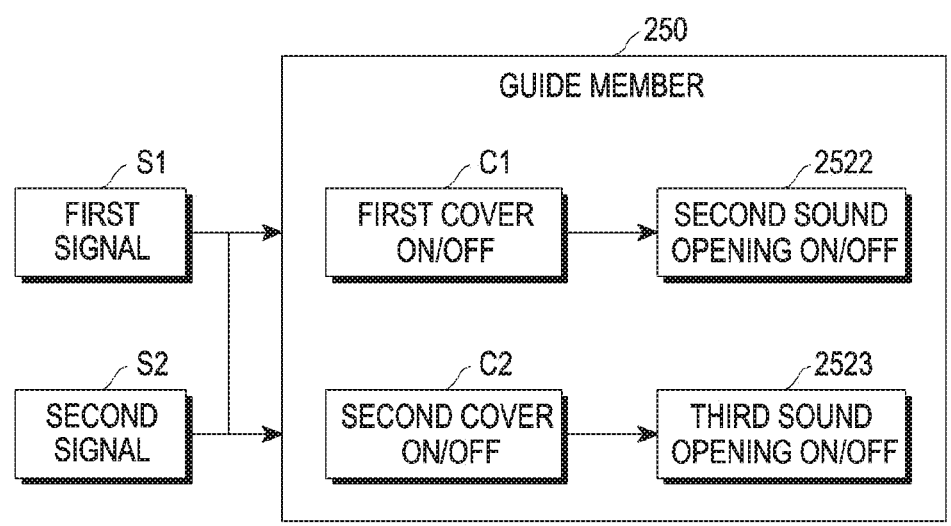
FIG. 12C is a driving block diagram of a guide member in an electronic device according to various embodiments of the present disclosure.

FIG. 12A illustrates a structure having two different modules mounted together therein and a structure of a corresponding guide member 250 in the electronic device 100 according to various embodiments of the present disclosure. FIG. 12B illustrates the guide member 250 in the electronic device 100 according to various embodiments of the present disclosure. FIG. 12C is a driving block diagram of the guide member 250 in the electronic device 100 according to various embodiments of the present disclosure.

Referring to FIGS. 12A through 12C, there is a difference than the embodiment illustrated in FIGS. 11A and 11B in terms of the structure of the opening 101. Thus, the description of the same structure or elements as in the previous embodiments will refer to the description of the previous embodiments.

The opening 101 according to the current embodiment may include the first opening 101a provided between the housing 110 and the display 120 and the second opening 101b formed in the side surface of the housing 110 that is adjacent to a module 230.

The first opening 101a is positioned in the second direction (the Z-axis direction) that is perpendicular to the signal output directions of an optical signal module 232 and a sound module 231, and the second opening 101b is positioned in the first direction (the X-axis direction) that is the same as the signal output directions of the optical signal module 232 and the sound module 231.

In this case, the guide member 250 may include the input surface A that is adjacent to the sound module 231 and the optical signal module 232, the output surface B (hereinafter, referred to as a "first output surface B") through which the sound signal and the light signal are output toward the first opening 101a, and the output surface B (hereinafter, referred to as a "second output surface C") through which the sound signal and the light signal are output to the second opening 101b.

In the input surface A are provided a first sound opening 2521 and a first light opening 2511. In the first output surface B are provided a second sound opening 2522 and a second light opening 2512 to output a sound signal and/or a light signal, introduced in the first direction (the X-axis direction) through the first sound opening 2521 and the first light opening 2511, in the second direction (the Z-axis direction), that is, to the first opening 101a. In the second output surface C are provided a third sound opening 2523 and a third light opening 2514 to output a sound signal and/or a light signal, introduced in the first direction (the X-axis direction) through the first sound opening 2521 and the first light opening 2511, in the first direction (the X-axis direction), that is, to the second opening 101b.

Depending on an internal structure of the guide member 250, the sound signal and/or the light signal may be output to the first opening 101a, the second opening 101b, or both of them.

For example, as in the previous embodiment, depending on, for example, application of power to the guide member 250 electrically connected to the substrate part 102, a reflective member 2513 arranged inside the guide member 250 may change between transparency and opacity. That is, when the power is not applied to the guide member 250, the reflective member 2513 may be opaque to reflect light like a mirror. On the other hand, when the power is applied to the guide member 250, the reflective member 2513 changes to be transparent so as to pass the light therethrough.

Depending on signal delivery to the guide member 250, on/off of the second sound opening 2522 arranged on the first output surface B and on/off of the third sound opening 2523 may be set. For example, a first cover C1 for on/off of the second sound opening 2521 according to delivery of a first signal S1 is provided in the second sound opening 2522, and a second cover C2 for on/off of the third sound opening 2523 according to delivery of a second signal S2 is provided in the third sound opening 2324.

Once the first signal S1 is delivered to the guide member 250, the first cover C1 is opened such that the first sound opening 2521 is on and the second sound opening 2522 is off, thus outputting the sound signal to the first opening 101*a*; once the second signal S2 is delivered to the guide member 250, the first sound opening 2521 is off and the second cover C2 is opened, and thus the second sound opening 2522 is on, thereby outputting the sound signal to the second opening 101*b*. When both the first signal S1 and the second signal S2 are delivered to the guide member 250, the first cover C1 and the second cover C2 are opened, such that the first sound opening 2521 is on and the second sound opening 2522 is on, thereby outputting the sound signal to both the first opening 101*a* and the second opening 101*b*.

Figure 13A:
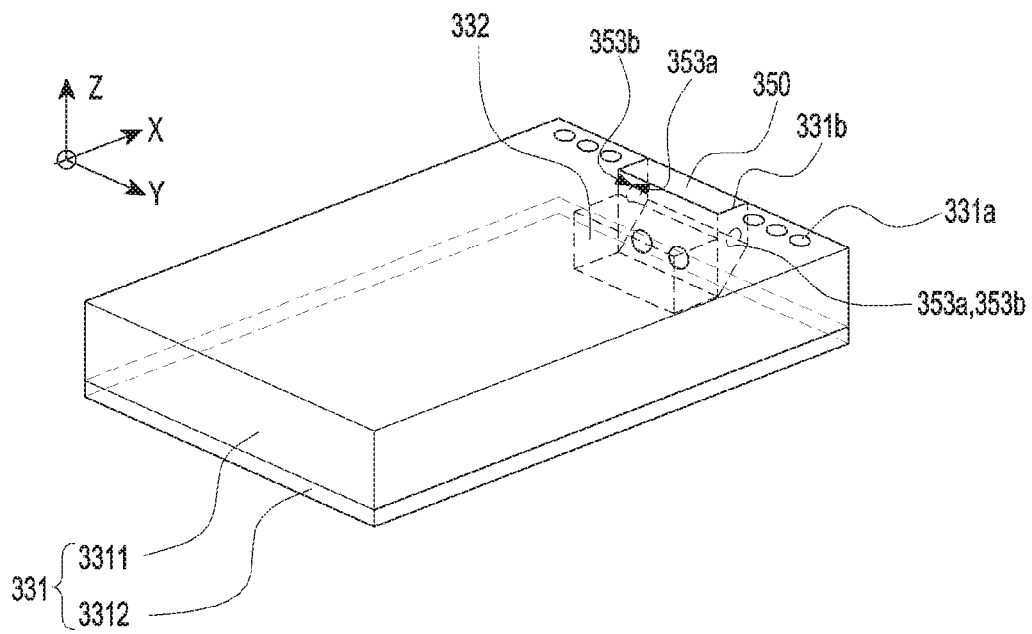
FIG. 13A illustrates a structure having two different modules mounted together therein and a structure of a corresponding guide member in an electronic device according to various embodiments of the present disclosure.
Figure 13B:
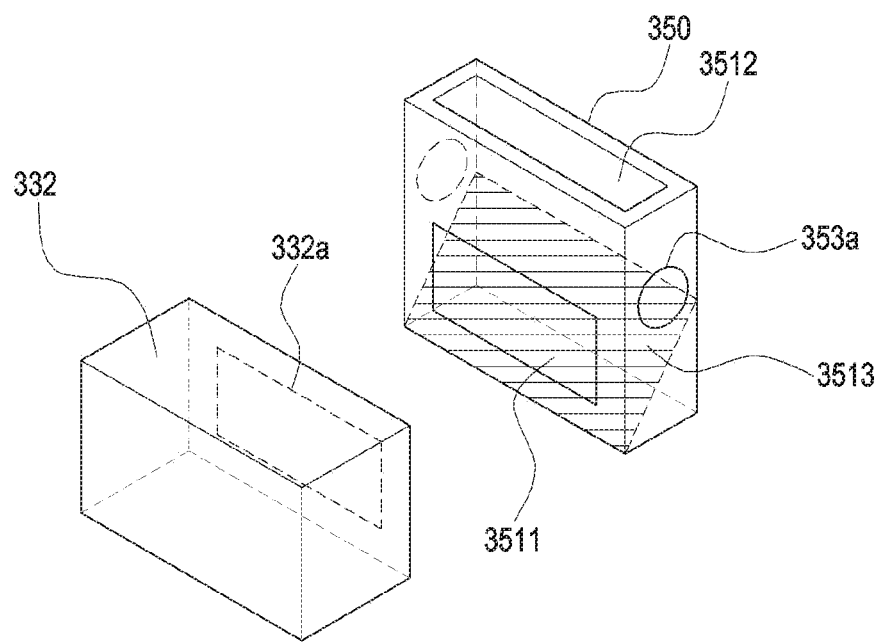
FIG. 13B illustrates a guide member in an electronic device according to various embodiments of the present disclosure.

FIG. 13A illustrates a structure having two different modules 330 mounted together therein and a structure of a corresponding guide member 350 in the electronic device 100 according to various embodiments of the present disclosure. FIG. 13B illustrates the guide member 350 in the electronic device 100 according to various embodiments of the present disclosure.

Referring to FIGS. 13A and 13B, as a structure where the modules 330, specifically, the optical signal module 332 is mounted in the sound module 331 is different from in the previous embodiment described with reference to FIGS. 11A and 11B, in the electronic device 100 according to various embodiments of the present disclosure, the structure of the guide member 350 may also become different. The description of the current embodiment that is the same as or overlaps with the description of the previous embodiments will refer to the description of the previous embodiments, and the following description will be made of differences than the previous embodiments.

Different two modules 330 according to an embodiment of the present disclosure, for example, the optical signal module 332 may be arranged on a part of a space of the sound module 331 by sharing the part of the space with the sound module 331 as in the previous embodiment. However, unlike in the previous embodiment, the shape of the sound module 331 and the mounting structure of the optical signal module 332 may be different. More specifically, a groove 331*b* may be formed to be recessed inward in the shape of bracket ("⊓") in the center of an end of the sound module 331, and the optical signal module 332 may be arranged inside a resonant member 3311 in adjacent to the recessed groove 331*b*. As the optical signal module 332 is arranged inside the resonant member 3311 adjacent to the recessed groove 331*b*, the guide member 350 is arranged on a space between sound outlets 331*a* in adjacent to the optical signal module 332. That is, while the optical signal module 332 is arranged on the rear surface of the sound module 331 in the previous embodiment, the optical signal module 332 is arranged on the same surface as the sound module 331 in the current embodiment.

In the previous embodiment, the input surface A of the guide member 350 is arranged in adjacent to both the sound module 331 and the optical signal module 332 to guide both the sound signal and the light signal in the sound module 331 and the optical signal module 332 that are arranged not to be exposed on the rear surface of the display 120, such that the guide member 350 is provided in the opening 101 to the same length as one end of the sound module 331 (long in a direction (the Y-axis direction) perpendicular to the first direction (the X-axis direction) and the second direction (the Z-axis direction)).

On the other hand, in the current embodiment, the guide member 350 is placed on the groove 331*b* recessed inward in the shape of bracket ("⊏") in the center of an end of the resonant member 3311, such that the input surface A of the guide member 350 faces the optical signal module 332 and both sides of the input surface A face opposing faces of the groove 331*b*. That is, the input surface A of the guide member 350 may be provided to face the optical signal module 332, and the output surface B of the guide member 350 may be provided to form the same surface as the sound outlet 1331*a* of the sound module 331.

In the input surface A of the guide member 350 may be provided a first light opening 3511 corresponding to a light outlet 332*a*, and in the output surface B of the guide member 350 may be provided a second light opening 3512 for outputting a light signal corresponding to the first direction (the X-axis direction), which is output in the first direction (the X-axis direction) and introduced to the first light opening 3511, in the second direction (the Z-axis direction). A reflective member 3513 such as a mirror may be included inside the guide member 350 to switch the light signal introduced in the first direction (the X-axis direction) to the second direction (the Z-axis direction), or the guide member 350 may be provided to form an inclined reflective surface.

When the guide member 350 is mounted in the housing 110 while being placed in the groove 331*b* of the sound module 331, the sound module 331 and the optical signal module 332 are arranged on the rear surface of the display 120, and the sound outlet 331*a* of the sound module 331 and the output surface B of the guide member 350 positioned between the sound outlets 331*a* are exposed to the opening 101.

The sound signal of the sound module 331 is output through the sound outlet 331*a* exposed through the opening 101.

The first light opening 3511 may also be connected with the optical signal module 332, specifically, the light outlet 332*a*, receive a light signal generated in the optical signal module 332, and output the light signal through the second light opening 3512.

On both sides of the input surface A of the guide member 350 may be formed a first hole 353*a* for connection with the sound module 331, specifically, the resonant member 3311, and on opposing surfaces of the groove 331*b* facing the both sides of the input surface A is formed a second hole 353*b* connected with the first hole 353*a*. Once the guide member 350 is placed in the groove 331*b* of the sound module 331, the inside of the resonant member 3311 and the inside of the guide member 350 are connected with each other through the first hole 353*a* and the second hole 353*b*. Thus, the light signal output in the first direction (the X-axis direction) from the optical signal module 332 is introduced through the first light opening 3511 provided in the input surface A of the guide member 350, is then refracted in the second direction (the Z-axis direction) through the reflective member 3513 inside the guide member 350, and is output to the second light opening 3512 of the output surface B.

The sound signal generated in the sound module 331 is output from the resonant member 3311 through the sound outlet 331*a*, and a part of the sound is introduced into the guide member 350 through the second hole 353*b* and the first hole 353*a* and is output through the second light opening 3512.

Figure 14:
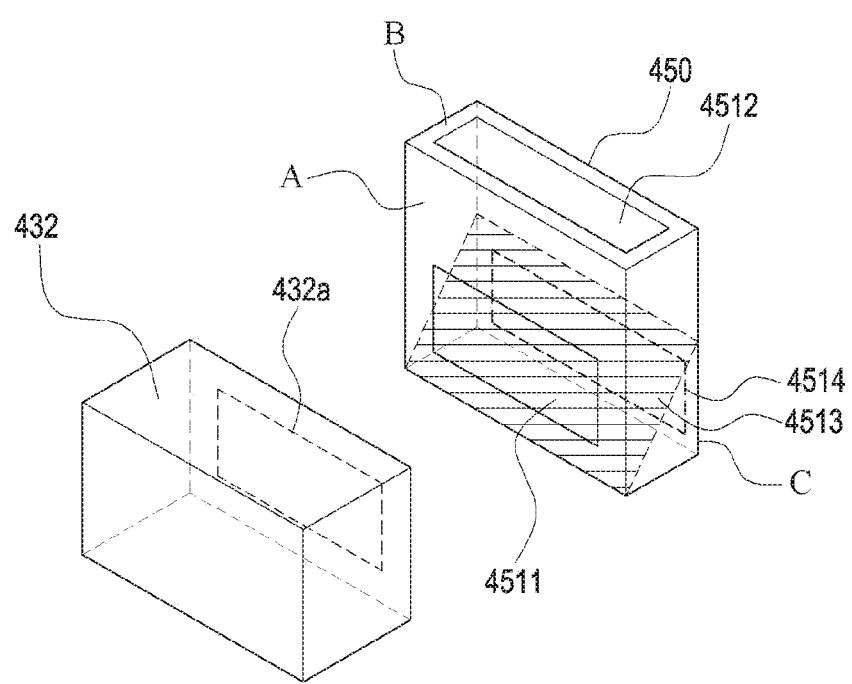
FIG. 14 illustrates another embodiment of a guide member in an electronic device according to various embodiments of the present disclosure.

FIG. 14 illustrates another embodiment of a guide member 450 in the electronic device 100 according to various embodiments of the present disclosure.

Referring to FIG. 14, there is a difference than the embodiment illustrated in FIGS. 13A and 13B in terms of the structure of the opening 101. Thus, the description of the same structure and element as in the previous embodiments will refer to the description of the previous embodiments.

More specifically, the opening 101 according to the current embodiment may include the first opening 101*a* provided between the housing 110 (see FIGS. 4 and 11A) and the display 120 (see FIG. 11A) and include the second opening 101*b* formed in the side surface of the housing 110 that is adjacent to the module 330 (see FIGS. 4 and 13A).

The first opening 101*a* is positioned in the second direction (the Z-axis direction) that is perpendicular to the signal output direction of the optical signal module 332, and the second opening 101*b* is positioned in the first direction (the X-axis direction) that is the same as the signal output direction of the optical signal module 332.

In this case, the guide member 450 may include the output surface (hereinafter, referred to as the "first output surface B") through which the light signal is output toward the first opening 101*a* and the output surface (hereinafter, referred to as the "second output surface C") through which the light signal is output to the second opening 101*b*.

In the first output surface B is provided a second light opening 4512 to output a light signal, introduced in the first direction (the X-axis direction) through the first light opening 432*a*, in the second direction (the Z-axis direction), that is, to the first opening 101*a*. In the second output surface C is provided a third light opening 4514 to output a light signal, introduced in the first direction (the X-axis direction) through the first sound opening 432*a*, in the first direction (the X-axis direction), that is, to the second opening 101*b*.

Depending on the internal structure of the guide member 450, the light signal may be output to the first opening 101*a* or the second opening 101*b*.

For example, as in the previous embodiment, depending on, for example, application of power to the guide member 450 electrically connected to the substrate part 102 (see FIG. 4), a reflective member arranged inside the guide member 450 may change between transparency and opacity. That is, when the power is not applied to the guide member 450, the reflective member 4513 may be opaque to reflect the light like a mirror. On the other hand, when the power is applied to the guide member 450, the reflective member 4513 changes to be transparent so as to pass the light therethrough.

Figure 15A:
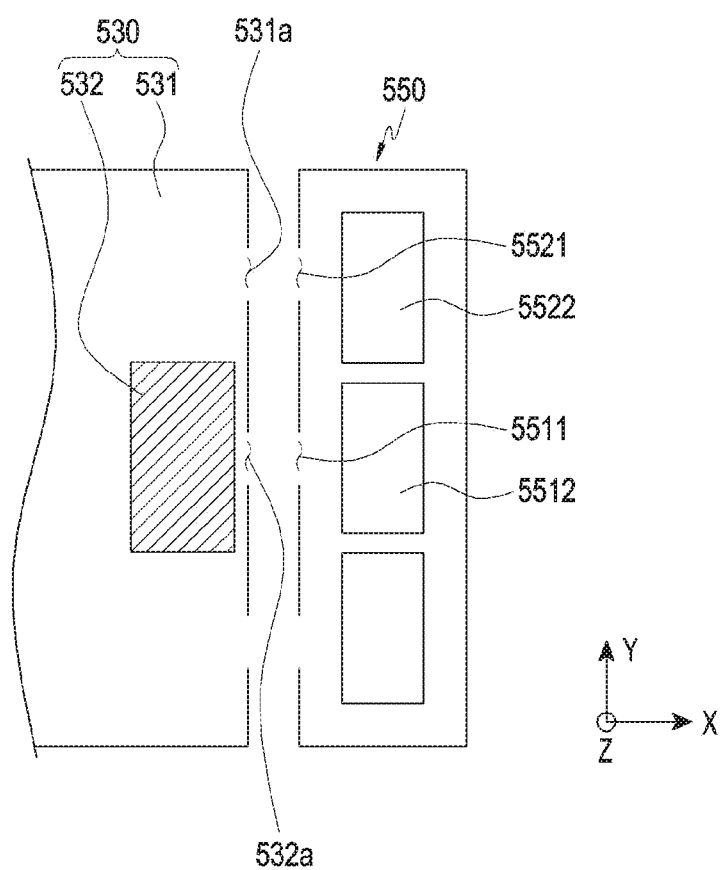
FIG. 15A illustrates a structure having two different modules mounted together therein and a structure of a corresponding guide member in an electronic device according to various embodiments of the present disclosure.
Figure 15B:
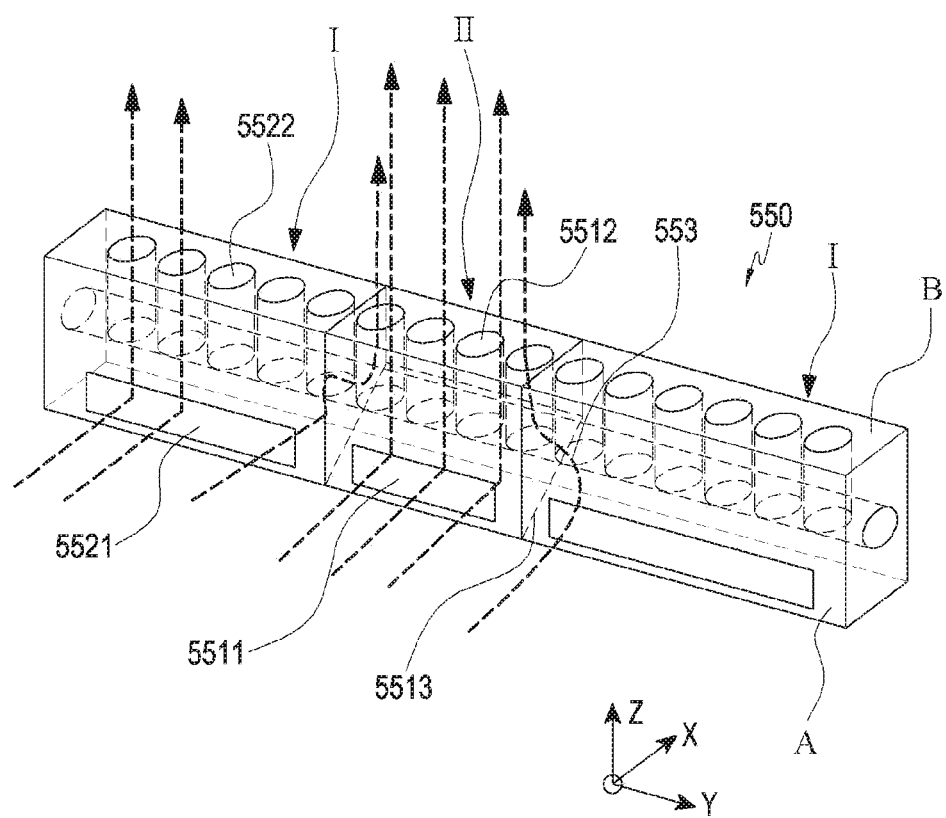
FIG. 15B illustrates a guide member in an electronic device according to various embodiments of the present disclosure.

FIG. 15A illustrates a structure having two different modules mounted together therein and a structure of a corresponding guide member 550 in the electronic device 100 according to various embodiments of the present disclosure. FIG. 15B illustrates the guide member 550 in the electronic device 100 according to various embodiments of the present disclosure.

Referring to FIGS. 15A and 15B, there is a difference than the embodiment illustrated in FIGS. 13A and 13B in terms of the structure of a sound module 531 and the structure of the opening 101.

The sound module 331 illustrated in FIGS. 13A and 13B has a groove in the center of the end thereof to have the guide member 350 mounted in the groove, and an end portion of the sound module 331 and the guide member 350 mounted in the groove are exposed through the opening 101. On the other hand, an optical signal module 532 according to an embodiment of the present disclosure is mounted in a center of the sound module 531, specifically, an inner center of the resonant member, such that end portions of the sound module 531 and the optical signal module 532 form the same surface as each other. On an end surface of the sound module 531, specifically, an end surface of the resonant member may be provided a sound outlet 531*a* for outputting the sound signal in the first direction (the X-axis direction). The optical signal module 532 is arranged in the center of an end of the sound module 531, and a light outlet 532*a* is provided to allow a light signal to be output in the first direction (the X-axis direction) from the optical signal module 532 between the sound outlets 531*a*.

Like in FIG. 11B, the guide member 550 according to the present disclosure may output in the second direction (the Z-axis direction), light and sound that are output in the first direction (the X-axis direction). The guide member 550 may include a surface for receiving light and sound (hereinafter, referred to as an "input surface A") and a surface for outputting light and sound (hereinafter, referred to as an "output surface B").

The output surface B is arranged on the opening 101, and the input surface A is arranged in adjacent to the sound module 531 and the optical signal module 531.

The guide member 550 is divided into a light guide section II provided to input or output a light signal of the optical signal module 531 and a sound guide section I provided to input or output a sound signal of the sound module 531. The light guide section II is connected with the sound guide section I, such that the sound may also be output through the light guide section II.

The light guide section II according to an embodiment may be arranged between the sound guide sections I. The light guide section II may include a first light opening 5511 formed in the input surface A to receive light emitted in the first direction (the X-axis direction) through the light outlet 532*a* of the optical signal module 531, a second light opening 5512 formed in the output surface B to output a light signal delivered to the first light opening 5511 in the second direction (the Z-axis direction), and a reflective member 5513, such as a mirror, or an inclined reflection surface to the light input in the first direction (the X-axis direction) into the second direction (the Z-axis direction), or an inclined reflection surface.

The sound guide sections I may be arranged on both sides of the light guide section II, and the sound guide section I may include a first sound opening 5521 formed in the input surface A to receive a sound signal output in the first direction (the X-axis direction) through the sound outlet 531*a* of the sound module 531 and a second sound opening 101 formed in the output surface B to discharge the sound signal delivered to the first sound opening in the second direction (the Z-axis direction).

The first light opening 5511 and the first sound opening 5521 are arranged in the input surface A in which the first light opening 5511 is arranged between the first sound openings 5521, and the second light opening 5512 and the second sound opening 101 are arranged in the output surface B in which the second light opening 5512 is arranged between the second sound openings 101. As the optical signal module 531 is arranged on the same plane as the resonant member, the first light opening 5511 and the first sound opening 5521 may be formed in the same position in the input surface A of the guide member 550.

Referring to a mounting structure of the housing 110 (see FIG. 3) in which the optical signal module 532 is placed on the rear surface of the sound module 531, the sound module 531 arranged on the rear surface of the optical signal module 532 is arranged on the rear surface of the display 120 such that the sound module 531 and the optical signal module 532 are not exposed to the outside, and the guide member 550 is placed inside the opening 101 such that the input surface A of the guide member 550 is provided to face a surface where the first sound opening 5521 and the first light opening 5511 are formed and the output surface B of the guide member 550 is exposed through the opening 101.

Thus, the first sound opening 5521 is connected with the sound module 531, specifically, the sound outlet 531*a*, receives a sound signal generated in the sound module 531, and outputs the sound signal through the second sound opening 101 exposed to the opening 101. The first sound opening 5511 may also be connected with the optical signal module 532, specifically, the light outlet 532*a*, receives a light or optical signal generated in the optical signal module 532, and outputs the light signal through the second light opening 5512 exposed to the opening 101.

In portions of both sides of the light guide section II, which are adjacent to the sound guide section I, connection holes 553 for operating with the sound guide sections I arranged on the both sides of the light guide section II may be further formed.

The light guide section II may be provided to input or output light through the light guide section II, and sound generated in the sound guide section I is introduced to the light guide section II through the connection holes 553 and is output through the light guide section II, specifically, the second light opening 5512.

Thus, the light signal is output or input through the light guide section II, and the sound signal is input or output through the sound guide section I, and when the connection holes 553 are formed, the sound signal may also be output through the light guide section II.

Figure 16A:
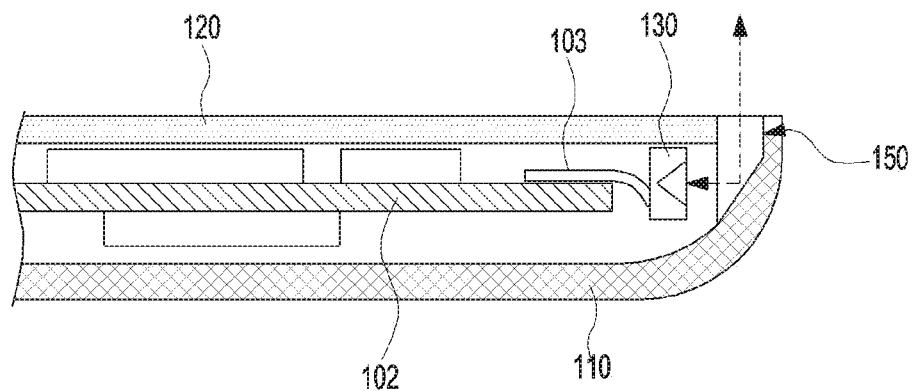
FIGS. 16A and 16B illustrate a mounting structure of a module in an electronic device according to various embodiments of the present disclosure.
Figure 16B:
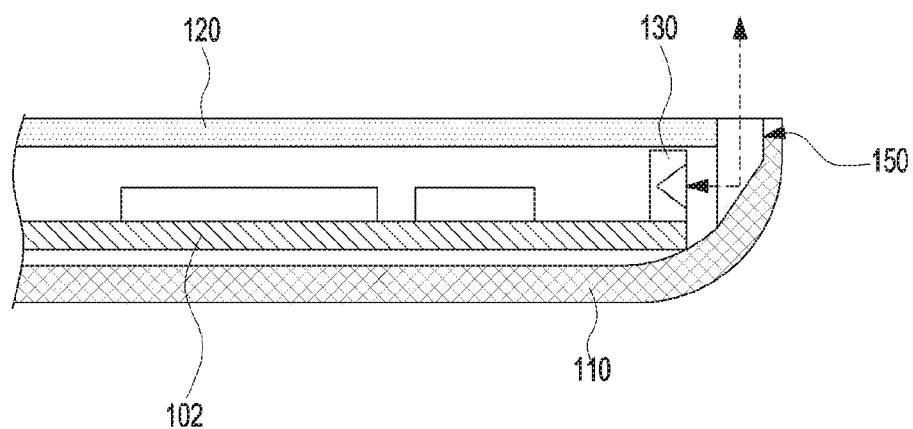

FIGS. 16A and 16B illustrate the mounting structure of the module 130 in the electronic device 100 according to various embodiments of the present disclosure.

Referring to FIGS. 16A and 16B, the light-emitting module 130 according to the present disclosure is mounted on the rear surface of the display 120 and inside the housing 110, and the substrate part 102 for having the light-emitting module 130 mounted thereon may be arranged inside the housing 110. The module 130 may be driven by being mounted directly on the substrate part 102 or by being mounted on the substrate part 102 through a connection module 103 such as flexible circuit board or the like.

As such, when a mounting space for mounting so as to be opened to the outside may not be secured, as the light-emitting module is arranged inside the housing 110, the mounting space may be secured inside the housing 110 and the light may be output through the opening 101 generated according to a tolerance between the housing 110 and the display 120 or the opening 101 smaller than a conventional opening without exposure of the module 130 to the outside.

The modules 130, conventionally mounted to be opened to the outside, may be mounted without being opened to the outside and driving thereof may be implemented so as to be opened to the outside, such that the display 120 may be mounted on the electronic device 100 as largely as a space where the modules 130 are not mounted, thereby providing the electronic device 100 that satisfies user's needs.

Hereinbelow, a description will be made of a case where the module 130 is the illumination sensor module 130.

The module 130 according to an embodiment may be the illumination sensor module 130. The illumination sensor module 130 may be mounted on the rear surface of the display 120 and inside the housing 110.

When the module 130 is the illumination sensor module 130, the guide member 150 receives external light to the illumination sensor module 130.

As the illumination sensor module 130 is provided such that to lead in the external light in the first direction (the X-axis direction in the present disclosure) of the electronic device 100, the opening 101 is arranged in a direction (the Z-axis direction in the present disclosure) perpendicular to the first direction (the X-axis direction), the guide member 150 is formed inclinedly inside the housing 110 to guide in the first direction (the X-axis direction), the external light introduced in the second direction (the Z-axis direction). The guide member 150 according to an embodiment may include at least one of a reflective member such as a mirror or a light-guiding member such as a waveguide.

The mounting position of the illumination sensor module 130 or the position or structure of the opening 101 are similar with the mounting position of the light-emitting module 130 or the structure of the opening 101 in the previous embodiments, and thus the description thereof will refer to the drawings described before.

In the previous embodiments, the opening 101 for introducing light into the illumination sensor module 130 may be arranged on two surfaces.

The opening 101 according to an embodiment may include the first opening 101*a* and the second opening 101*b*.

The first opening 101*a* is provided between the housing 110 and the display 120, and the second opening 101*b* is provided on the side surface of the housing 110, which is adjacent to the illumination sensor module 130.

The first opening 101*a* is positioned in the second direction (the Z-axis direction) that is perpendicular to a light-receiving part of the illumination sensor module 130, and the second opening 101*b* is positioned in the first direction (the X-axis direction) that is the same as the light-receiving part of the illumination sensor module 130. The guide member 150 may be provided to introduce external light, introduced in the first direction (the X-axis direction) or the second direction (the Z-axis direction), to the illumination sensor module 130.

For example, the guide member 150 may be electrically connected with a board unit 102 and may be provided to change between transparency and opacity depending on application of power or switching of setting. That is, when the power is not applied to the guide member 150, the guide member 150 may be opaque to reflect light like a mirror. When the power is applied to the guide member 150, the guide member 150 changes to be transparent so as to pass the light therethrough.

Thus, when the power is not applied to the guide member 150, the light led in through the first opening 101*a* in the second direction (the Z-axis direction) is reflected in the first direction (the X-axis direction) by the guide member 150 and is introduced to the illumination sensor module 130. On the other hand, when the power is applied to the guide member 150, the light led in through the second opening 101*b* in the first direction (the X-axis direction) is introduced to the illumination sensor module 130 by passing through the guide member 150.

In an embodiment, the guide member 150 that delivers external light to the illumination sensor module 130 may include the lens part 150*a* (see FIG. 10B) for collecting the external light or outputting received light to the illumination sensor module 130.

The lens part 150*a* may be mounted in the side of the illumination sensor module 130 or in the side of the opening 101, or in both of them. When being mounted in the side of the illumination sensor module 130, the lens part 150*a* may collect and output external light toward the illumination sensor module 130 through the guide side. When being mounted in the side of the opening 101, the lens part 150*a* may collect external light toward the guide member 150. The guide member 150 may include a guide housing that is connected from the side of the opening 101 to the light-emitting module 130 and collects light from the light-emitting module 130 or outputs received light. That is, the guide housing leads in the light emitted from the light-emitting module 130, reflects the emitted light toward the opening 101, and outputs the light to the opening 101.

The illumination sensor module 130 according to the present disclosure is mounted on the rear surface of the display 120 and inside the housing 110, and the substrate part 102 for having the illumination sensor module 130 mounted thereon may be arranged inside the housing 110. The illumination sensor module 130 may be driven by being mounted directly on the substrate part 102 or by being mounted on the substrate part 102 by the connection module 130 such as flexible circuit board or the like.

Figure 17A:
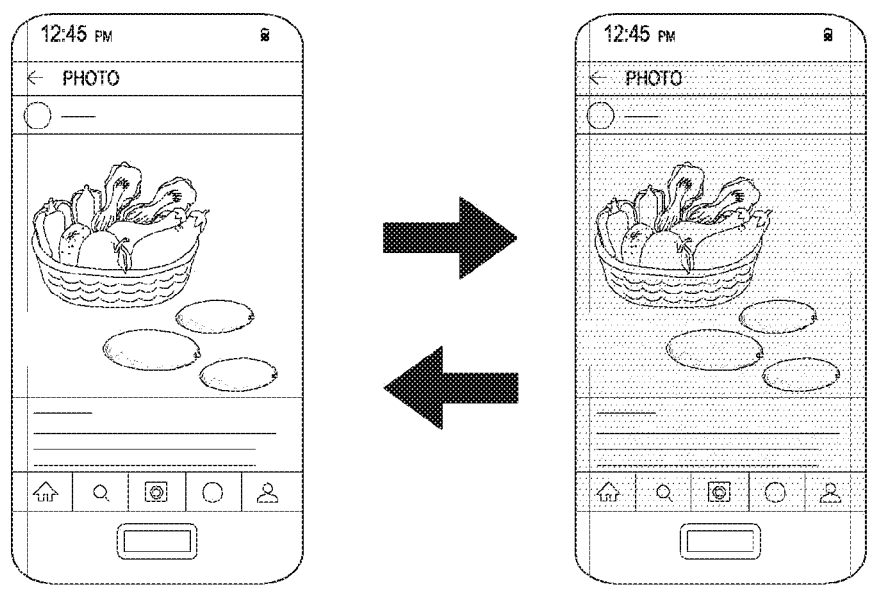
FIG. 17A illustrate an application example of an electronic device based on driving of an illumination sensor module in an electronic device according to the present disclosure.

FIG. 17A illustrates an application example of the electronic device 100 based on driving of the illumination sensor module 130 in the electronic device 100 according to the present disclosure.

Referring to FIG. 17A, the illumination sensor module 130 is connected with the outside by the guide member 150 even when being mounted inside the housing 110, without being connected directly with the outside, such that the illumination sensor module 130 may receive external light and perform various driving operations corresponding thereto even when the illumination sensor module 130 does not have as a large mounting space as enough to be opened to the outside.

For example, when being used in a bright place, the electronic device 100 may be set to lower the brightness of a screen because external light may be strongly led in to the illumination sensor module 130; when being used in a dark place, the electronic device 100 may be set to increase the brightness of the screen because the external light may be weakly led in to the illumination sensor module 130.

In this way, the light-emitting module 130, conventionally mounted to be opened to the outside, may be mounted without being opened to the outside and driving thereof may be implemented so as to be opened to the outside, such that the display 120 may be mounted on the electronic device 100 as largely as a space where the module 130 is not mounted, thereby providing the electronic device 100 that satisfies user's needs.

Figure 17B:
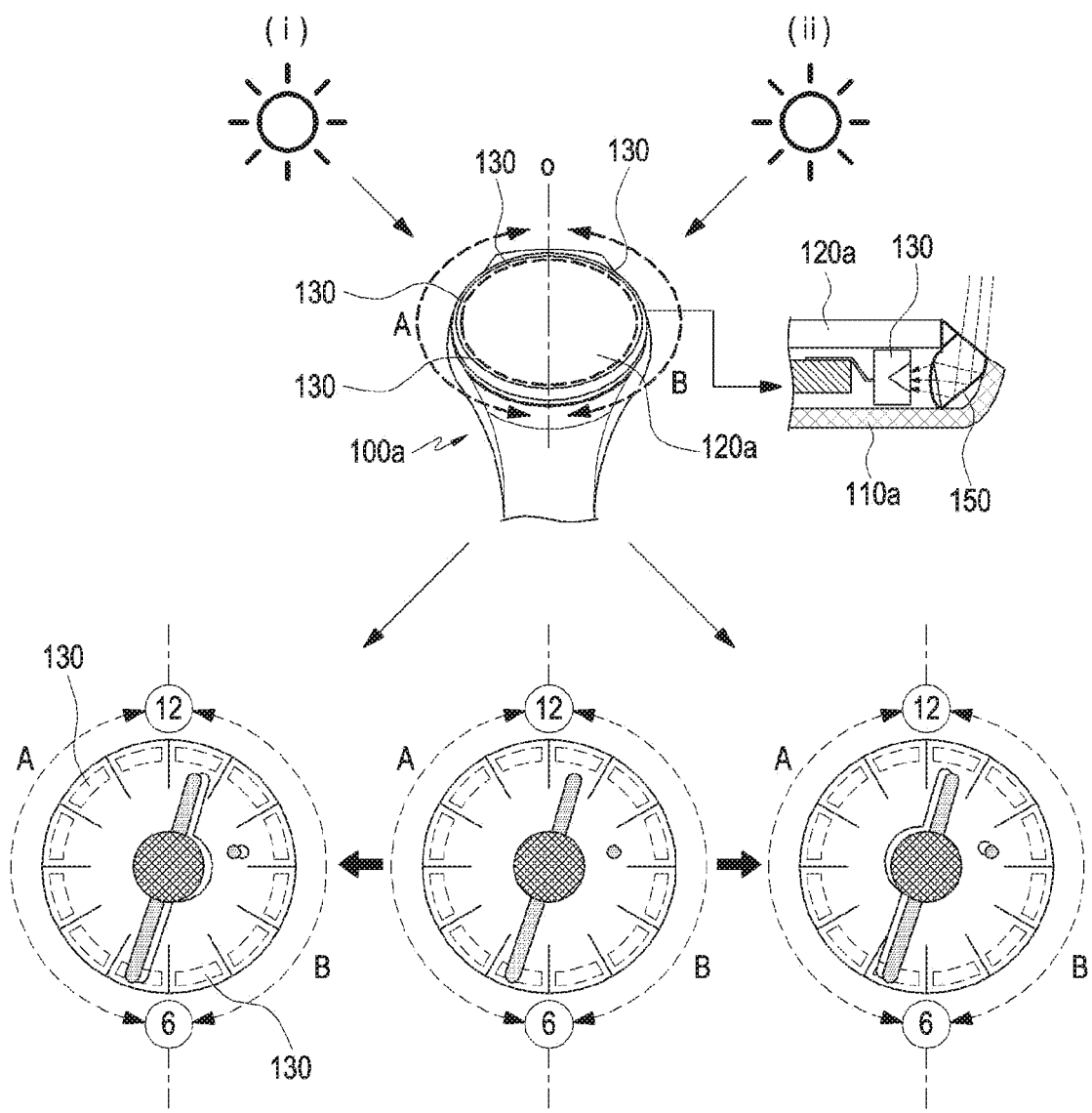
FIG. 17B illustrate another application example of an electronic device based on driving of an illumination sensor module in an electronic device according to the present disclosure.

FIG. 17B illustrates an application example of an electronic device 100a based on driving of the illumination sensor module 130 in the electronic device 100a according to the present disclosure.

Referring to FIG. 17B, the electronic device 100 according to an embodiment may be a wearable electronic device, for example, a watch-type electronic device 100a on which the illumination sensor module 130 according to an embodiment of the present disclosure is mounted. That is, the illumination sensor module 130 may be mounted on a rear surface of a display 120a of the wearable electronic device 100a, and a guide member 130a is mounted in an opening generated by coupling between a housing 110a and the display 120a, such that external light is introduced to the illumination sensor module 130 through the guide member 130a. In particular, the wearable electronic device 100a, because of being worn on a user's body, has restrictions in the size, limiting mounting of a module that needs to be exposed to the outside, but as in the current embodiment, the module needing to be exposed to the outside, for example, the illumination sensor module 130 may receive external light even when mounted inside the housing 110a, removing a need for an additional mounting space for the module having to be exposed to the outside.

As such, in the wearable electronic device 100a according to an embodiment of the present disclosure, a plurality of illumination sensor modules 130 may be provided along the circumference of the display 120a on the rear surface of the display 120a, and the guide member 130a may be provided to correspond to the plurality of illumination sensor modules 130. Thus, when the user wears the watch-type electronic device 100a on a user's wrist, introduced light may vary from the illumination sensor module 130 to the illumination sensor module 130 depending on a position of the sun.

For example, as the sun (or 'light') shines from the left with respect to an axis O aligned along '12'-'6' of the watch-type electronic device 100a, more light may be introduced to the illumination sensor module 130 arranged to the left with respect to the axis O (referred to as an 'A-side illumination sensor module 130') than the illumination sensor module 130 arranged to the right with respect to the axis O (referred to as a 'B-side illumination sensor module 130'). That is, a measurement value of the A-side illumination sensor module 130 may be greater than that of the B-side illumination sensor module 130. The wearable electronic device 100a may be driven with various user settings corresponding to the measurement value. For example, when the A-side illumination sensor module 130 has a greater measurement value than the B-side illumination sensor module 130 as the sun shines from the left with respect to the axis O, a shadow may be generated to the right of the hour hand and the minute hand; whereas when the B-side illumination sensor module 130 has a greater measurement value than the A-side illumination sensor module 130 as the sun shines from the left with respect to the axis O, the shadow may be generated to the left of the hour hand and the minute hand.

In this way, the light-emitting module 130, conventionally mounted to be opened to the outside, may be mounted without being opened to the outside and driving thereof may be implemented so as to be opened to the outside, such that the size of the electronic device 100a may be reduced as much as a space where the illumination sensor module 130 has to be exposed to the outside and on the other hand, the display 120a may be mounted as largely as the space, thereby providing the electronic device 100a that satisfies user's needs.

Hereinbelow, a description will be made of a case where the module 130 is the imaging module 130.

Figure 18A:
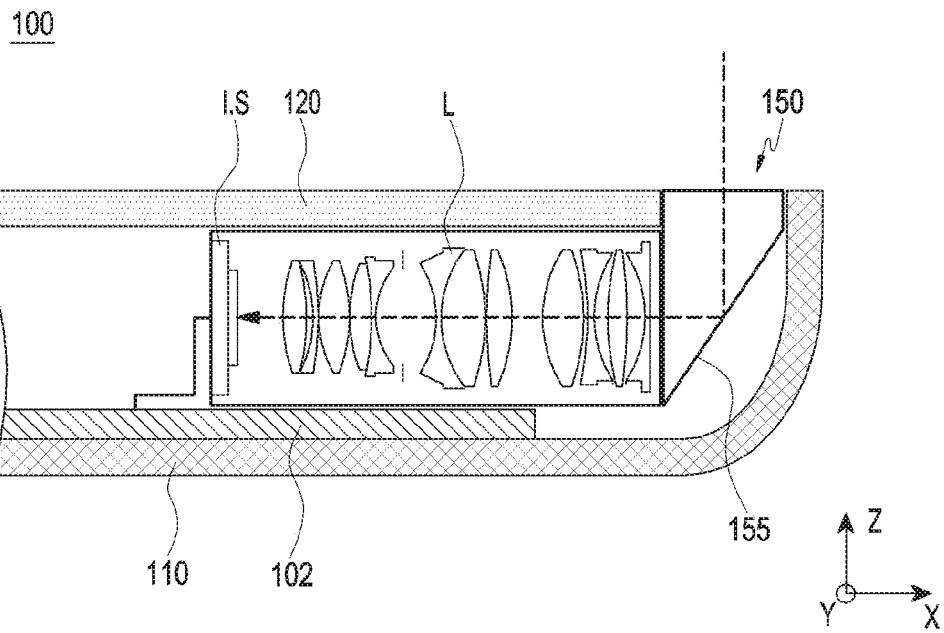
FIG. 18A illustrates an electronic device having an imaging module mounted thereon according to the present disclosure.

FIG. 18A illustrates the electronic device 100 having the imaging module 130 mounted thereon according to the present disclosure. The module 130 according to an embodiment may be the imaging module 130. The imaging module 130 may be mounted on the rear surface of the display 120 and inside the housing 110.

When the module 130 is the imaging module 130, the guide member 150 delivers an image of an external object to the imaging module 130.

As the imaging module 130 is stacked to lead in the image of the external object in the first direction (the X-axis direction in the present disclosure) of the electronic device 100 and the opening 101 is arranged in the second direction (the Z-axis direction in the present disclosure) perpendicular to the first direction (the X-axis direction), the guide member 150 is formed inclinedly inside the housing 110 to guide in the first direction (the X-axis direction), the image of the external object introduced in the second direction (the Z-axis direction). The guide member 150 according to an embodiment may include at least one of a reflective member such as a mirror or a light-guiding member such as a waveguide.

More specifically, the imaging module 130 according to an embodiment of the present disclosure may include a plurality of lenses L and an image sensor IS on which an image of an external object falls after passing through the lenses L. The plurality of lenses L and the image sensor IS according to an embodiment may be stacked in the first direction (the X-axis direction).

The imaging module 130 may be mounted on the rear surface of the display 120 and inside the housing 110. The guide member 150 may be provided to deliver an image of an external object to the imaging module 130. To receive the image in the first direction (the X-axis direction in the present disclosure) of the electronic device 100, the imaging module 130 may be stacked such that the optical axes of the plurality of lenses L and the image sensor IS are facing the first direction (the X-axis direction). As the opening 101 is arranged in the second direction (the Z-axis direction in the present disclosure) perpendicular to the first direction (the X-axis direction), the guide member 150 is placed in the opening 101 adjacent to the imaging module 130 to introduce the image of the external object introduced in the second direction (the Z-axis direction) to the imaging module 130 stacked in the first direction (the X-axis direction). A member 155 may be formed inclinedly inside the guide member 150 to refract in the first direction (the X-axis direction) the image of the external object introduced in the second direction (the Z-axis direction). The member 155 arranged inside the guide member 150 according to an embodiment may include at least one of a reflective member such as a mirror or a light-guiding member such as a waveguide.

Although not shown, the opening 101 according to an embodiment of the present disclosure may have a structure for introducing the image of the external object to at least two surfaces.

The opening 101 according to an embodiment may include the first opening 101a and the second opening 101b.

The first opening 101a is provided between the housing 110 and the display 120, and the second opening 101b is provided in the side surface of the housing 110, which is adjacent to the imaging module 130.

The first opening 101a is positioned in the second direction (the Z-axis direction) that is perpendicular to the introduction direction of the image from the imaging module 130, and the second opening 101b is positioned in the first direction (the X-axis direction) that is the same as the introduction direction of the image from the imaging module 130. The guide member 150 may be provided to introduce the image of the external object, introduced in the first direction (the X-axis direction) or the second direction (the Z-axis direction), to the imaging module 130.

For example, the guide member 150 may be electrically connected with a substrate part 102 and may be provided to change between transparency and opacity depending on application of power or switching of setting. That is, when the power is not applied to the guide member 150, the guide member 150 may be opaque to reflect the image of the external object, like a mirror. When the power is applied to the guide member 150, the guide member 150 changes to be transparent so as to pass the image introduced in the first direction (the X-axis direction) therethrough directly to the imaging module 130.

Thus, when the power is not applied to the guide member 150, the image of the external object led in through the first opening 101a in the second direction (the Z-axis direction) is reflected in the first direction (the X-axis direction) by the guide member 150, and is introduced to the imaging module 130. On the other hand, when the power is applied to the guide member 150, the image of the external object led in through the second opening 101b in the first direction (the X-axis direction) is introduced to the imaging module 130 by passing through the guide member 150.

In the previous embodiment, the opening 101 according to an embodiment of the present disclosure may have a structure for introducing the image of the external object to the imaging module 130 through each of three surfaces of the housing 110.

The opening 101 according to an embodiment may include the first opening 101a, the second opening 101b, and a third opening 101c.

The first opening 101a is provided between the housing 110 and the display device, the second opening 101b is provided in the side surface of the housing 110 that is adjacent to the imaging module 130, and the third opening 101c is provided in a surface of the housing 110 that opposes the first opening 101a, for example, in the second surface of the housing 110 if the first opening 101a is mounted in the first surface of the housing 110.

When the optical axis direction along which the image is introduced to the imaging module 130 is the first direction (the X-axis direction), then the first opening 101a is positioned in the second direction (a +Z-axis direction) that is perpendicular to the first direction (the X-axis direction) of the imaging module 130, the second opening 101b is positioned in the first direction (the X-axis direction) that is the same as the output direction of the light from the imaging module 130, and the third opening 101c is positioned in a third direction (a −Z-axis direction) that is perpendicular to the output direction of the light from the imaging module 130.

The guide member 150 may be provided to introduce an image, introduced in the first direction (the X-axis direction), the second direction (the Z-axis direction), or the third direction, to the imaging module 130 stacked in the first direction (the X-axis direction).

For example, the guide member 150 may be electrically connected with the substrate part 102 and may be provided to change between transparency and opacity depending on application of power or switching of setting. More specifically, the guide member 150 may include a first guide member 151 capable of reflecting the light in the first direction (the X-axis direction) and a second guide member 152 capable of reflecting the light in the second direction (the Z-axis direction). For example, the first guide member 151 may change to be opaque by non-application of the power thereto and the second guide member 152 may change to be transparent by application of the power thereto. As a result, the image introduced in the second direction (the Z-axis direction) through the first opening 101a is reflected by the first guide member 151 and is reflected in the first direction (the X-axis direction), and the image reflected in the first direction (the X-axis direction) is introduced to the imaging module 130. On the other hand, when the first guide member 151 and the second guide member 152 change to be transparent by application of the power thereto, the image introduced in the first direction (the X-axis direction) through the second opening 101b may be introduced to the imaging module 130 stacked in the first direction (the X-axis direction) by passing through the transparent first guide member 151 and second guide member 152. On the other hand, the first guide member 151 may change to be transparent by application of the power thereto and the second guide member 152 may change to be opaque by non-application of the power thereto. As a result, the image introduced in the third direction through the third opening 101c is reflected by the second guide member 152 in the first direction (the X-axis direction) and is introduced to the imaging module 130 stacked in the first direction (the X-axis direction).

The guide member 150 according to an embodiment of the present disclosure may include a lens part for introducing an image to the imaging module 130 or outputting the introduced image to the imaging module 130.

The lens part may be mounted in the side of the imaging module 130 or in the side of the opening 101, or in both of them.

The guide member 150 may include a guide housing that connects from the opening 101 to the imaging module 130 and delivers an image introduced through the opening 101 to the imaging module 130. The guide housing may include a shielding material for preventing introduction of light from the periphery of the guide housing. Thus, the guide housing may be provided to prevent light from being introduced from the outside of the guide housing while outputting an image of an external object introduced through the opening 101 to the imaging module 130.

The imaging module 130 according to the present disclosure is mounted on the rear surface of the display 120 and inside the housing 110, and the substrate part 102 for having the imaging module 130 mounted thereon may be arranged inside the housing 110. The imaging module 130 may be driven by being mounted directly on the substrate part 102 or by being mounted on the substrate part 102 through the connection module 130 such as flexible circuit board or the like.

Figure 18B:
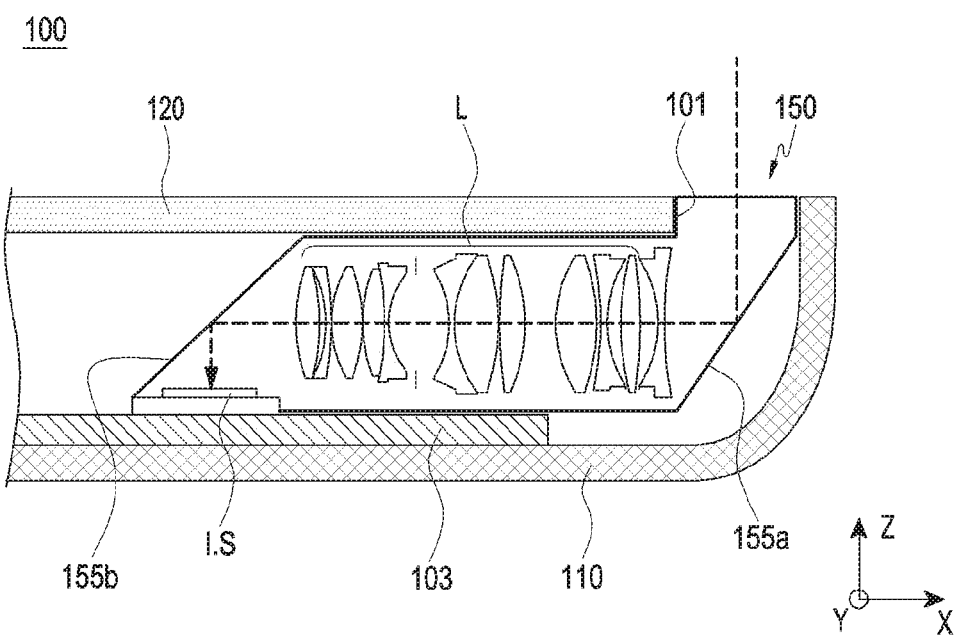
FIG. 18B illustrates another embodiment of an electronic device having an imaging module mounted thereon according to the present disclosure.

FIG. 18B illustrates another embodiment of an electronic device having an imaging module mounted thereon according to the present disclosure.

Referring to FIG. 18B, with a different stacking structure of the plurality of lenses and the image sensor than in the embodiment illustrated in FIG. 18A, a corresponding guide member has a different structure. Thus, the description of the same structure or elements as in the previous embodiment will refer to the description of the previous embodiment.

The imaging module 130 according to the current embodiment is arranged on the rear surface of the display 120 so as not to be exposed through the opening 101, but stacking arrangement of the plurality of lenses L and the image sensor IS is different from that of the previous embodiment. The plurality of lenses L according to an embodiment of the present disclosure are stacked on the rear surface of the display 120 in the first direction (the X-axis direction), such that the plurality of lenses L form an optical axis in the first direction (the X-axis direction). The image sensor IS may be provided in perpendicular to the optical axis of the plurality of lenses L. The optical axis of the image sensor IS may be formed in the second direction (the Z-axis direction).

The guide member 150 may include a first guide 155a for bending in the first direction (the X-axis direction), an image of an external object introduced in the second direction through the opening 101 and a second guide 155b for refracting an image of an external object refracted in the first direction (the X-axis direction) through the first guide 155a to the image sensor that forms the optical axis in the second direction (the Z-axis direction) after passing through the plurality of lenses L.

The image of the external object introduced in the second direction (the Z-axis direction) through the opening 101 is bent by the first guide 155a and switches to the first direction (the X-axis direction), and the image of the external object passing through the plurality of lenses L after switching to the first direction (the X-axis direction) is bent again by the second guide 155b and thus switches to the second direction (the Z-axis direction), thus being introduced to the image sensor IS.

As such, the imaging module 130 that needs to be opened to the outside may be mounted not to be exposed to the outside and driving thereof may be implemented so as to be opened to the outside, and as the imaging module 130 is arranged inside to the housing 110 so as not to be exposed to the outside, a mounting space may be secured inside the housing 110 and the light may be output through the opening 101 generated according to a tolerance between the housing 110 and the display 120 or through the opening 101 smaller than a conventional opening without exposure of the module 130 to the outside.

In addition, the modules 130, conventionally mounted to be opened to the outside, may be mounted without being opened to the outside and driving thereof may be implemented so as to be opened to the outside, such that the display 120 may be mounted on the electronic device 100 as largely as a space where the modules 130 are not mounted, thereby providing the electronic device 100 that satisfies user's needs.

Hereinbelow, a description will be made of a case where the module 130 is the screen module 130.

Figure 19:
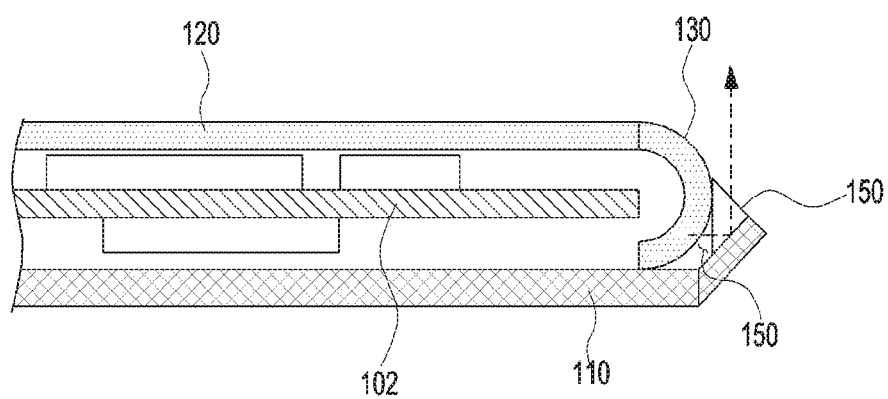
FIG. 19 illustrates an embodiment in which a module is a display in an electronic device according to various embodiments of the present disclosure.
Figure 20:
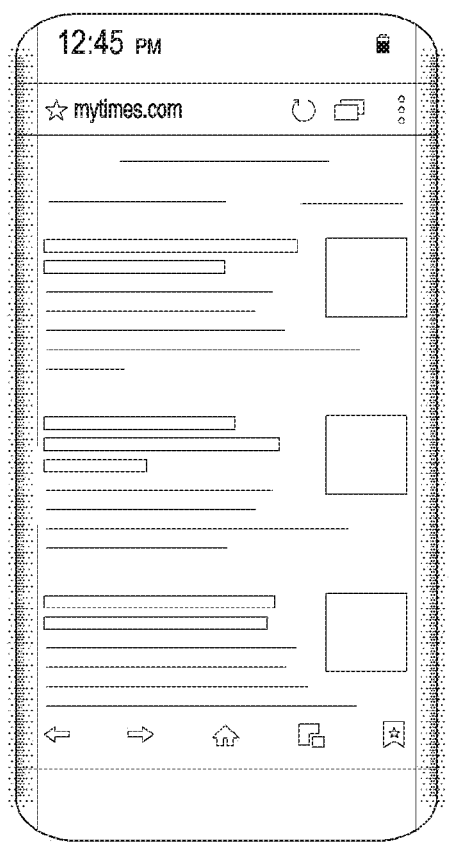
FIG. 20 illustrates an application example based on a screen module and a guide member in an electronic device according to various embodiments of the present disclosure.

FIG. 19 illustrates an embodiment where the module 130 is the display 120 in the electronic device 100 according to various embodiments of the present disclosure. FIG. 20 illustrates application examples corresponding to the screen module 130 and the guide member 150 in the electronic device 100 according to various embodiments of the present disclosure.

Referring to FIGS. 19 and 20, the module 130 according to an embodiment may be the screen module 130. The screen module 130 may be mounted inside the housing 110. When the module 130 is the screen module 130, the guide member 150 delivers a screen displayed on the internal screen module 130 to the outside through the opening 101, thus visualizing the screen to the user.

As the screen module 130 displays the screen in the first direction (the X-axis direction in the present disclosure) of the electronic device 100 and the opening 101 is arranged in the second direction (the Z-axis direction in the present disclosure) perpendicular to the first direction (the X-axis direction), the guide member 150 is formed inclinedly inside the housing 110 to guide in the first direction (the X-axis direction), the screen output in the first direction (the X-axis direction). The guide member 150 according to an embodiment may include at least one of a reflective member such as a mirror or a light-guiding member such as a waveguide.

The screen module 130 may be mounted inside the housing 110 by being connected so as to be flexibly bent at an end portion of the display 120.

On the other hand, the screen module 130 may be mounted as a separate member from the display 120 on the rear surface of the display 120 and inside the housing 110 (see (b) of FIG. 20).

Thus, the electronic device 100 may include a first screen region for displaying the screen through the display 120 and a second screen region for displaying the screen connected to the first screen region through the screen module 130.

The guide member 150 according to the current embodiment may be provided to reflect the screen in the second screen region positioned inside the housing 110 so as to output the screen through the opening 101.

The screen in the first screen region and the screen in the second screen region may be provided to display interconnected screens or separate screens. For example, when the second screen region displays the screen interconnected with the first screen region, the user may check displayed contents through a screen extended by the added second screen region. When the second screen region displays a separate screen from the first screen region, the user may check the screen displayed on the display 120 through the first screen region and may check the screen displayed through the second screen region at a side of the first screen region, for example, time, an application being executed, or the like.

The guide member 150 may be arranged to correspond to the screen module 130, and may include at least one of a reflective member and a light-guiding member.

Hence, when the screen is bent and thus side portions thereof are used as the screen, a region that is not visualized due to coupling between the display 120 and the housing 110 may be provided to the user, thereby displaying a large screen to the user.

Although not shown, the module 130 according to an embodiment may be the proximity sensor module 130.

The proximity sensor module 130 is mounted to sense contact or proximity of an object, and may be mounted on the rear surface of the display 120 and inside the housing 110. Light-receiving and light-emitting units for sensing proximity of the object may be arranged perpendicularly to the opening 101. That is, as the proximity sensor module 130 is provided to sense proximity or contact of an object in the first direction (the X-axis direction in the present disclosure) of the electronic device 100 and the opening 101 is arranged in the second direction (the Z-axis direction in the present disclosure) perpendicular to the first direction (the X-axis direction), the guide member 150 is formed inclinedly inside the housing 110 to guide in the first direction (the X-axis direction), the proximity or contact sensed in the second direction (the Z-axis direction).

Hereinafter, an electronic device according to various embodiments of the present disclosure will be described with reference to the accompanying drawings. Herein, the term "user" used in various embodiments of the present disclosure may refer to a person who uses the electronic device or a device using the electronic device.

Figure 21:
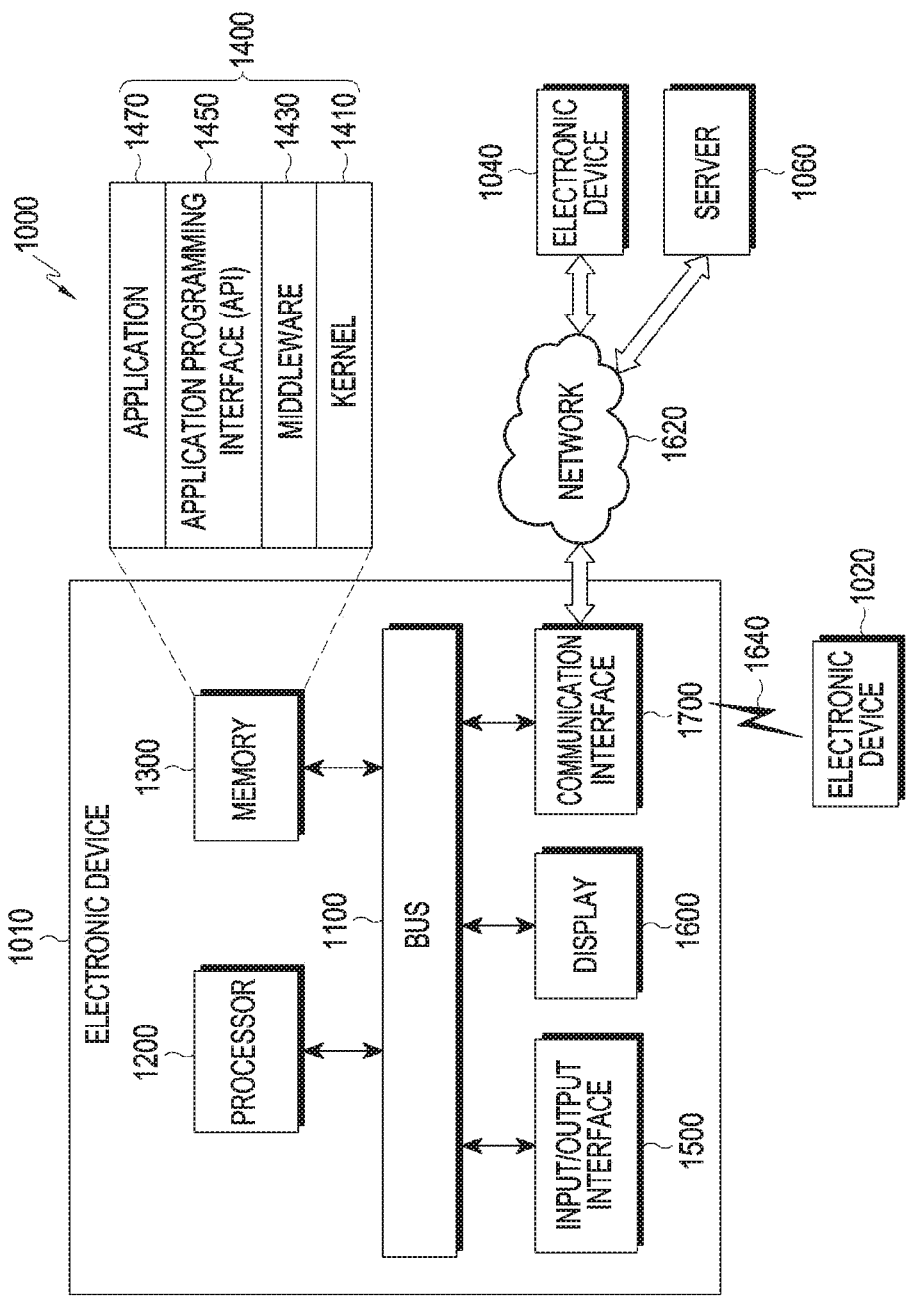
FIG. 21 illustrates an electronic device in a network environment according to various embodiments.

Referring to FIG. 21, an electronic device 1010 in a network environment 1000 according to various embodiments of the present disclosure is disclosed. The electronic device 1010 may include a bus 1100, a processor 1200, a memory 1300, an input/output (I/O) interface 1500, a display 1600, and a communication interface 1700. According to some embodiments, the electronic device 1010 may omit at least one of the foregoing elements or may further include other elements.

The bus 1100 may include a circuit for connecting, e.g., the elements 1100 to 1700 and delivering communication (e.g., a control message and/or data) between the elements 1100 to 1700.

The processor 1200 may include one or more of a central processing unit (CPU), an application processor (AP), and a communication processor (CP). The processor 1200 performs operations or data processing for control and/or communication of, for example, at least one other elements of the electronic device 1010.

The memory 1300 may include a volatile and/or nonvolatile memory. The memory 1300 may store, for example, instructions or data associated with at least one other elements of the electronic device 1010. According to an embodiment of the present disclosure, the memory 1300 may store software and/or a program 1400. The program 1400 may include at least one of, for example, a kernel 1410, middleware 1430, an application programming interface (API) 1450, and/or an application program (or "application") 1470, and the like. At least some of the kernel 1410, the middleware 1430, and the API 1450 may be referred to as an operating system (OS).

The kernel 1410 may control or manage, for example, system resources (e.g., the bus 1100, the processor 1200, the memory 1300, etc.) used to execute operations or functions implemented in other programs (e.g., the middleware 1430, the API 1450, or the application program 1470). The kernel 1410 provides an interface through which the middleware 1430, the API 1450, or the application program 1470 accesses separate components of the electronic device 1010 to control or manage the system resources.

The middleware 1430 may work as an intermediary for allowing, for example, the API 1450 or the application program 1470 to exchange data in communication with the kernel 1410.

In addition, the middleware 1430 may process one or more task requests received from the application program 1470 based on priorities. For example, the middleware 1430 may give a priority for using a system resource (e.g., the bus 1100, the processor 1200, the memory 1300, etc.) of the electronic device 1010 to at least one of the application programs 1470. For example, the middleware 1430 may perform scheduling or load balancing with respect to the one or more task requests by processing the one or more task requests based on the priority given to the at least one of the application programs 1470.

The API 1450 is an interface used for the application 1470 to control a function provided by the kernel 1410 or the middleware 1430, and may include, for example, at least one interface or function (e.g., a command) for file control, window control, image processing or character control.

The I/O interface 1500 serves as an interface for delivering, for example, a command or data input from a user or another external device to other component(s) of the electronic device 1010. The I/O interface 1500 may also output a command or data received from other component(s) of the electronic device 1010 to a user or another external device.

The display 1600 may include, for example, a liquid crystal display (LCD), a light emitting diode (LED) display, an organic light emitting diode (OLED) display, a microelectromechanical system (MEMS) display, or an electronic paper display. The display 1600 may, for example, display various contents (e.g., a text, an image, video, an icon, a symbol, etc.) to users. The display 1600 may include a touch screen, and receives a touch, a gesture, proximity, or a hovering input, for example, by using an electronic pen or a part of a body of a user.

The communication interface 1700 establishes communication between the electronic device 1010 and an external device (e.g., a first external electronic device 1020, a second external electronic device 1040, or a server 1060). For example, the communication interface 1700 may be connected to a network 1620 through wireless communication or wired communication to communicate with an external device (e.g., the second external electronic device 1040 or the server 1060).

The wireless communication may use, as a cellular communication protocol, for example, at least one of Long Term Evolution (LTE), LTE-Advanced (LTE-A), Code Division Multiple Access (CDMA), Wideband CDMA (WCDMA), a Universal Mobile Telecommunication System (UMTS), Wireless Broadband (WiBro), or Global System for Mobile Communications (GSM). The wired communication may include, for example, short-range communication 1640. The short-range communication 164 may include, for example, at least one of WiFi, Bluetooth, NFC, and GNSS. Depending on a usage area or bandwidth, the GNSS may include, for example, at least one of a global positioning system (GPS), a global navigation satellite system (Glonass), a Beidou navigation satellite system ("Beidou"), and Galileo, and the European global satellite-based navigation system. Hereinbelow, "GPS" may be used interchangeably with "GNSS". The wired communication may include, for example, at least one of USB, a high definition multimedia interface (HDMI), recommended standard 232 (RS-232), and a plain old telephone service (POTS). The network 1620 may include a telecommunications network, for example, at least one of a computer network (e.g., a local area network (LAN) or a wide area network (WAN)), Internet, and a telephone network.

Each of the first external electronic device 1020 and the second external electronic device 1040 may be a device of the same type as or a different type than the electronic device 1010. According to an embodiment of the present disclosure, the server 1060 may include a group of one or more servers. According to various embodiments of the present disclosure, some or all of operations performed by the electronic device 1010 may be performed in another electronic device or a plurality of electronic devices (e.g., the electronic device 1020,1040 or the server 1060). According to an embodiment of the present disclosure, when the electronic device 1010 has to perform a function or a service automatically or at a request, the electronic device 1010 may request another device (e.g., the electronic devices 1020 or 1040 or the server 1060) to perform at least some functions associated with the function or the service instead of or in addition to executing the function or the service. The another electronic device (e.g., the electronic device 1020 or 1040 or the server 1060) may execute the requested function or additional function and deliver the execution result to the electronic device 1010. The electronic device 1010 may then process or further process the received result to provide the requested function or service. To that end, a cloud computing, distributed computing, or client-server computing technology may be used, for example.

Figure 22:
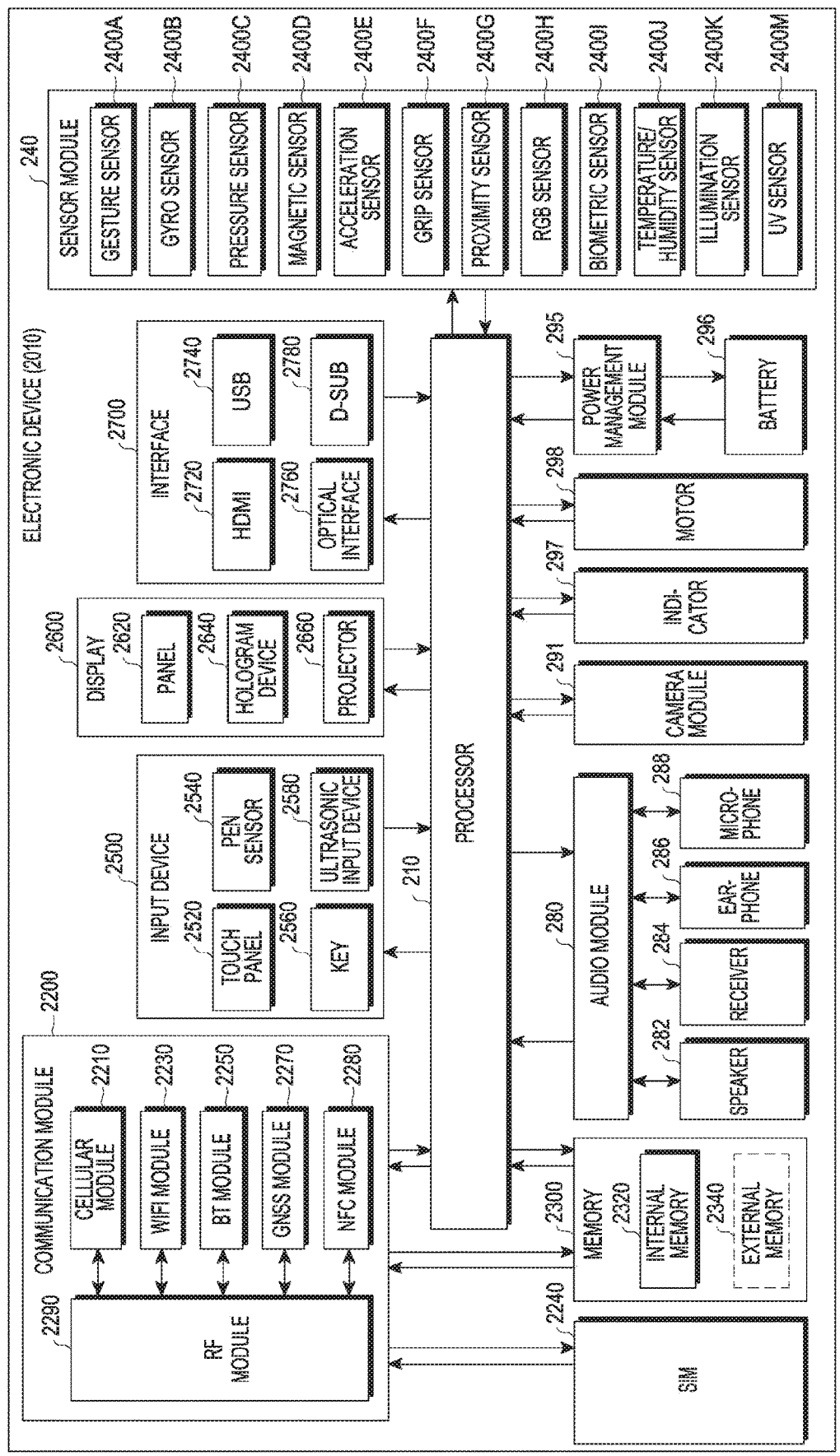
FIG. 22 is a block diagram of an electronic device according to various embodiments.

FIG. 22 is a block diagram of an electronic device 2010 according to various embodiments of the present disclosure.

The electronic device 2010 may form the entire electronic device 1010 illustrated in FIG. 21 or a part of the electronic device 101 illustrated in FIG. 1. The electronic device 2010 may include one or more processors (e.g., application processors (APs)) 2100, a communication module 2200, a subscriber identification module (SIM) 2240, a memory 2300, a sensor module 2400, an input device 2500, a display 2600, an interface 2700, an audio module 2800, a camera module 2910, a power management module 2950, a battery 2960, an indicator 2970, and a motor 2980. The processor 2100 controls multiple hardware or software components connected to the processor 2100 by driving an Operating System (OS) or an application program, and performs processing and operations with respect to various data. The processor 2100 may be implemented with, for example, a system on chip (SoC). According to an embodiment of the present disclosure, the server 2100 may include a GPU and/or an image signal processor. The processor 2100 may include at least some of the elements illustrated in FIG. 22 (e.g., the cellular module 2210). The processor 2100 loads an instruction or data received from at least one of other elements (e.g., a non-volatile memory) into a volatile memory to process the instruction or data, and stores result data in the non-volatile memory.

The communication module 2200 may have a configuration that is the same as or similar to the communication interface 1700. The communication module 2200 may include, for example, the cellular module 2210, a WiFi module 2230, a Bluetooth (BT) module 2250, a GNSS module 2270, a near field communication (NFC) module 2280, and a radio frequency (RF) module 2290. The cellular module 2210 may provide, for example, a voice call, a video call, a text service, or an Internet service over a communication network. According to an embodiment, the cellular module 2210 identifies and authenticates the electronic device 2010 in a communication network by using the SIM 2240 (e.g., a SIM card). According to an embodiment, the cellular module 2210 performs at least one of functions that may be provided by the processor 2100. According to an embodiment, the cellular module 2210 may include a communication processor (CP). According to some embodiment, at least some (e.g., two or more) of the cellular module 2210, the WiFi module 2230, the BT module 2250, the GNSS module 2270, and the NFC module 2280 may be included in one integrated chip (IC) or IC package. The RF module 2290 may, for example, transmit and receive a communication signal (e.g., an RF signal). The RF module 2290 may include a transceiver, a power amp module (PAM), a frequency filter, a low noise amplifier (LNA), or an antenna. According to another embodiment, at least one of the cellular module 2210, the WiFi module 2230, the BT module 2250, the GNSS module 2270, and the NFC module 2280 may transmit and receive an RF signal through the separate RF module. The SIM 2240 may, for example, include a card including a SIM or an embedded SIM, and may include unique identification information (e.g., an integrated circuit card identifier (ICCID) or subscriber information (e.g., an international mobile subscriber identity (IMSI)).

The memory 2300 (e.g., the memory 1300) may, for example, include an internal memory 2320 and/or an external memory 2340. The internal memory 2320 may, for example, include at least one of a volatile memory (e.g., dynamic random-access memory (DRAM), static RAM (SRAM), synchronous dynamic RAM (SDRAM), etc.), and a non-volatile memory (e.g., one time programmable read only memory (OTPROM), programmable ROM (PROM), erasable and programmable ROM (EPROM), electrically erasable and programmable ROM (EEPROM), etc.), mask ROM, flash ROM, a flash memory, and a solid-state drive (SSD). The external memory 2340 may further include flash drive, for example, compact flash (CF), secure digital (SD), micro-SD, mini-SD, extreme Digital (xD), a multi-media card (MMC), or a memory stick. The external memory 2340 may be functionally or physically connected with the electronic device 2010 through various interfaces.

The sensor module 2400 measures physical quantity or senses an operation state of the electronic device 2010 to convert the measured or sensed information into an electric signal. The sensor module 2400 may, for example, include at least one of a gesture sensor 2400A, a gyro sensor 2400B, a pressure sensor 2400C, a magnetic sensor 2400D, an acceleration sensor 2400E, a grip sensor 2400F, a proximity sensor 2400G, a color sensor 2400H (e.g., RGB sensor), a biometric sensor 2400I, a temperature/humidity sensor 2400J, an illumination sensor 2400K, and a ultraviolet (UV) sensor 2400M. Additionally or alternatively, the sensor module 2400 may include an E-nose sensor (not shown), an electromyography (EMG) sensor (not shown), an electroencephalogram (EEG) sensor (not shown), an electrocardiogram (ECG) sensor (not shown), an infrared (IR) sensor, an iris sensor, and/or a fingerprint sensor. The sensor module 2400 may further include a control circuit for controlling at least one sensor included therein. In an embodiment, the electronic device 2010 may further include a processor configured to control the sensor module 2400 as part of or separately from the processor 2100, to control the sensor module 2400 during a sleep state of the processor 2100.

The input device 2500 may include, for example, a touch panel 2520, a (digital) pen sensor 2540, a key 2560, or an ultrasonic input device 2580. The touch panel 2520 may use at least one of a capacitive type, a resistive type, an IR type, or an ultrasonic type. The touch panel 2520 may further include a control circuit. The touch panel 2520 may further include a tactile layer to provide tactile reaction to the user. The (digital) pen sensor 2540 may include a recognition sheet which is a part of the touch panel 2520 or a separate recognition sheet. The key 2560 may also include a physical button, an optical key, or a keypad. The ultrasonic input device 2580 senses ultrasonic waves generated by an input means through a microphone (e.g., the microphone 2880) and checks data corresponding to the sensed ultrasonic waves.

The display 2600 (e.g., the display 1600) may include a panel 2620, a hologram device 2640, or a projector 2660. The panel 2620 may have a configuration that is the same as or similar to the display 1600 illustrated in FIG. 21. The panel 2620 may be implemented to be flexible, transparent, or wearable. The panel 2620 may be configured with the touch panel 2520 in one module. The hologram device 2640 shows a stereoscopic image in the air by using interference of light. The projector 2660 displays an image onto a screen through projection of light. The screen may be positioned inside or outside the electronic device 2010. According to an embodiment, the display 2600 may further include a control circuit for controlling the panel 2620, the hologram device 2640, or the projector 2660.

The interface 2700 may include an HDMI 2720, a universal serial bus (USB) 2740, an optical communication 2760, or a D-subminiature 2780. The interface 2700 may be included in the communication interface 1700 illustrated in FIG. 21. Additionally or alternatively, the interface 2700 may include, for example, a mobile high-definition link (MHL) interface, an SD card/MMC interface, or an Infrared Data Association (IrDA) standard interface.

The audio module 2800 bi-directionally converts sound and an electric signal. At least some element of the audio module 2800 may be included, for example, in the I/O interface 1450 illustrated in FIG. 1. The audio module 2800 processes sound information input or output through the speaker 2820, the receiver 2840, the earphone 2860, or the microphone 2880. The camera module 2910 is, for example, a device capable of capturing a still image or a moving image, and according to an embodiment, may include one or more image sensors (e.g., a front sensor or a rear sensor), a lens, an image signal processor (ISP), or a flash (e.g., an LED, a xenon lamp, etc.). The power management module 2950 manages power of the electronic device 2010. According to an embodiment, the power management module 2950 may include a power management integrated circuit (PMIC), a charger IC, or a battery fuel gauge. The PMIC may have a wired and/or wireless charging scheme. The wireless charging scheme includes a magnetic-resonance type, a magnetic induction type, and an electromagnetic type, and may further include an additional circuit for wireless charging, for example, a coil loop, a resonance circuit, or a rectifier. The battery gauge measures the remaining capacity of the battery 2960 or the voltage, current, or temperature of the battery 2960 during charging. The battery 2960 may include, for example, a rechargeable battery and/or a solar battery.

The indicator 2970 displays a particular state, for example, a booting state, a message state, or a charging state, of the electronic device 2010 or a part thereof (e.g., the processor 2100). The motor 2980 converts an electric signal into mechanical vibration or generates vibration or a haptic effect. The electronic device 2010 may include a device for supporting the mobile TV (e.g., a GPU) to process media data according to a standard such as digital multimedia broadcasting (DMB), digital video broadcasting (DVB), or mediaFlo™. Each of the foregoing elements described herein may be configured with one or more components, names of which may vary with a type of the electronic device. In various embodiments, some components of the electronic device (e.g., the electronic device 2010) may be omitted or may further include other elements, and some of the components may be coupled to form one entity and identically perform functions of the components before being coupled.

Each of the foregoing elements described herein may be configured with one or more components, names of which may vary with a type of the electronic device. In various embodiments, the electronic device may include at least one of the foregoing elements, some of which may be omitted or to which other elements may be added. In addition, some of the elements of the electronic device according to various embodiments may be integrated into one entity to perform functions of the corresponding elements in the same manner as before they are integrated.

Figure 23:
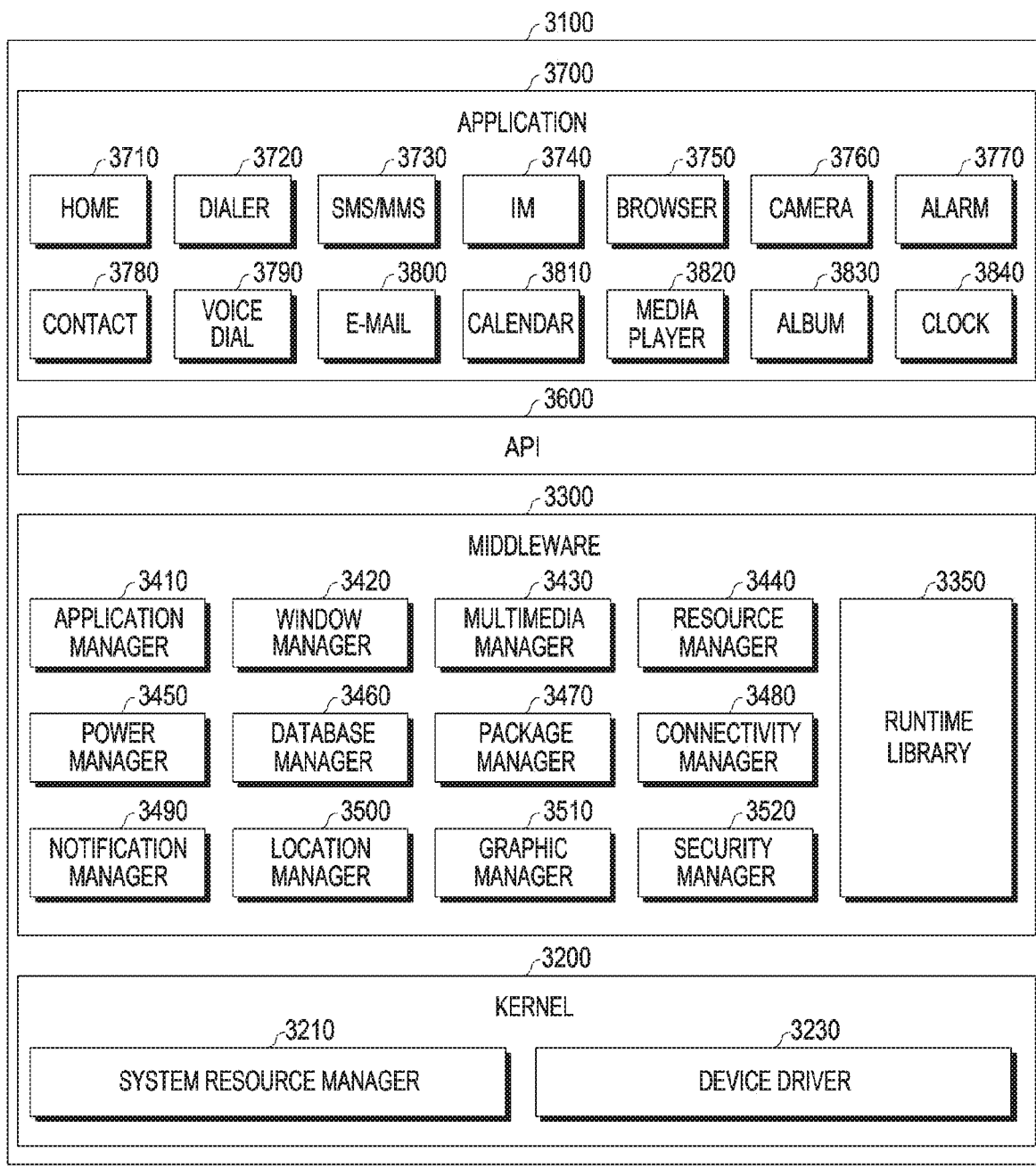
FIG. 23 is a block diagram of a programming module according to various embodiments.

FIG. 23 is a block diagram of a programming module according to various embodiments. According to an embodiment, a programming module 3100 (e.g., the program 1400) may include an OS for controlling resources associated with an electronic device (e.g., the electronic device 1010) and/or various applications (e.g., the application program 1470) executed on the OS. The OS may include, for example, Android™, iOS™, Window™, Symbian™, Tizen™, Bada™, or the like.

The programming module 3100 may include, for example, a kernel 3200, middleware 3300, an application programming interface (API) 3600, and/or an application 3700. At least a part of the programming module 3100 may be preloaded on an electronic device or may be downloaded from an external device (e.g., the external device 1020 or 1040 or the server 1060).

The kernel 3200 (e.g., the kernel 1410) may include, for example, a system resource manager 3210 and/or a device driver 3230. The system resource manager 3210 may perform control, allocation, retrieval of system resources, and so forth. According to an embodiment, the system resource manager 3210 may include a process management unit, a memory management unit, a file system management unit, and the like. The device driver 3230 may include, for example, a display driver, a camera driver, a Bluetooth driver, a shared memory driver, a USB driver, a keypad driver, a WiFi driver, an audio driver, or an inter-process communication (IPC) driver.

The middleware 3300 may include provide functions that the application 3700 commonly requires or provide various functions to the application 3700 through the API 3600 to allow the application 3700 to efficiently use a limited system resource in an electronic device. According to an embodiment, the middleware 3300 (e.g., the middleware 1430) may include at least one of a runtime library 3350, an application manager 3410, a window manager 3420, a multimedia manager 3430, a resource manager 3440, a power manager 3450, a database manager 3460, a package manager 3470, a connectivity manager 3480, a notification manager 3490, a location manager 3500, a graphic manager 3510, and a security manager 3520.

The runtime library 3350 may include a library module that a compiler uses to add a new function through a programming language while the application 3700 is executed. The runtime library 3350 performs functions related to an input/output, memory management, or calculation operation.

The application manager 3410 manages a life cycle of at least one of the applications 3700. The window manager 3420 manages a graphic user interface (GUI) resource used on a screen. The multimedia manager 3430 recognizes a format necessary for playing various media files and performs encoding or decoding on a media file by using a codec appropriate for a corresponding format. The resource manager 3440 manages a resource such as source code, a memory, or a storage space of at least one of the applications 3700.

The power manager 3450 manages a battery or power, for example, in operation with a basic input/output system (BIOS) and provides power information necessary for an operation of the electronic device. The database manager 3460 performs a management operation to generate, search or change a database used for at least one application among the applications 3700. The package manager 3470 manages the installation or update of an application distributed in a package file format.

The connectivity manager 3480 manages a wireless connection such as a WiFi or Bluetooth connection. The notification manager 3490 displays or notifies events such as arrival messages, appointments, and proximity alerts in a manner that is not disruptive to a user. The location manager 3500 manages location information of an electronic device. The graphic manager 3510 manages a graphic effect to be provided to a user or a user interface relating thereto. The security manager 3520 provides a general security function necessary for system security or user authentication. According to an embodiment, if the electronic device (e.g., the electronic device 1010) has a call function, the middleware 3300 may further include a telephony manager for managing a voice or video call function of the electronic device.

The middleware 3300 may include a middleware module forming a combination of various functions of the above-mentioned internal elements. The middleware 3300 may provide modules specified according to types of OS so as to provide distinctive functions. Additionally, the middleware 3300 may delete some of existing elements or add new elements dynamically.

The API 3600 (e.g., the API 1450) may be provided as a set of API programming functions with a different configuration according to the OS. For example, in Android or iOS, one API set may be provided for each platform, and in Tizen, two or more API sets may be provided for each platform.

The application 3700 (e.g., the application program 1470) may include one or more applications capable of providing a function, for example, a home application 3710, a dialer application 3720, a short messaging service/multimedia messaging service (SMS/MMS) application 3730, an instant message (IM) application 3740, a browser application 3750, a camera application 3760, an alarm application 3770, a contact application 3780, a voice dial application 3790, an e-mail application 3800, a calendar application 3810, a media player application 3820, an album application 3830, a clock application 3840, a health care application (e.g., an application for measuring an exercise amount, a blood sugar, etc.), or an environment information providing application (e.g., an application for providing air pressure, humidity, or temperature information or the like).

According to an embodiment, the application 3700 may include an application (hereinafter, an "information exchange application" for convenience) supporting information exchange between the electronic device (e.g., the electronic device 1010) and an external electronic device (e.g., the electronic device 1020 or 1040). The information exchange application may include, for example, a notification relay application for transferring specific information to the external electronic device or a device management application for managing the external electronic device.

For example, the notification relay application may include a function for transferring notification information generated in another application (e.g., an SMS/MMS application, an e-mail application, a health care application, or an environment information application) of the electronic device to an external electronic device (e.g., the electronic device 1020 or 1040). The notification relay application may receive notification information from an external electronic device to provide the same to a user.

The device management application may manage (e.g., install, remove, or update) at least one function (e.g., turn on/turn off of an external electronic device itself (or a part thereof) or control of brightness (or resolution) of a display) of an external device (e.g., the electronic device 1020 or 1040) communicating with the electronic device, a service provided by an application operating in an external electronic device or provided by the external electronic device (e.g., a call service or a message service).

According to an embodiment, the application 3700 may include an application (e.g., device health care application of mobile medical equipment) designated according to an attribute of the external electronic device (e.g., the electronic device 1020 or 1040). According to an embodiment, the application 3700 may include an application received from the external electronic device (e.g., the server 1060 or the electronic device 1020 or 1040). According to an embodiment, the application 3700 may include a preloaded application or a third-party application that may be downloaded from the server. Names of elements of the programming module 3100 according to the illustrated embodiment may vary depending on a type of an OS.

According to various embodiments, at least a part of the programming module 3100 may be implemented by software, firmware, hardware, or a combination of at least two of them. The at least a part of the programming module 3100 may be implemented (e.g., executed) by a processor (e.g., the processor 2100). At least some of the programming module 3100 may include, for example, modules, programs, routines, sets of instructions, or processes for performing one or more functions.

A term "module" used herein may mean, for example, a unit including one of or a combination of two or more of hardware, software, and firmware. The "module" may be interchangeably used with a unit, a logic, a logical block, a component, or a circuit. The "module" may be a minimum unit or a portion of an integrated component. The "module" may be a minimum unit or part thereof, adapted to perform one or more functions. The "module" may be implemented mechanically or electronically. For example, the "module" according to the embodiments may include at least one of an application-specific integrated circuit (ASIC) chip, field-programmable gate arrays (FPGAs), and a programmable-logic device performing certain operations already known or to be developed.

At least a part of an apparatus (e.g., modules or functions thereof) or a method (e.g., operations) according to various embodiments may be implemented with instructions stored in a computer-readable storage medium in the form of a programming module. When the instructions are executed by one or more processors (for example, the processor 1200), the one or more processors may perform functions corresponding to the instructions. The computer-readable storage medium may be, for example, a memory included in the memory 1300.

The computer readable recording medium includes hard disk, floppy disk, or magnetic media (e.g., a magnetic tape, optical media (e.g., compact disc read only memory (CD-ROM) or digital versatile disc (DVD), magneto-optical media (e.g., floptical disk), a hardware device (e.g., read only memory (ROM), random access memory (RAM), flash memory, etc.), and so forth. Further, the program instructions include a machine language code created by a complier and a high-level language code executable by a computer using an interpreter. The foregoing hardware device may be configured to be operated as at least one software module to perform an operation of the present disclosure, or vice versa.

Modules or programming modules according to various embodiments of the present disclosure may include one or more of the foregoing elements, have some of the foregoing elements omitted, or further include additional other elements. Operations performed by the modules, the programming modules or other elements according to various embodiments may be executed in a sequential, parallel, repetitive or heuristic manner. Also, some of the operations may be executed in different order or omitted, or may have additional different operations. The embodiments disclosed herein have been provided for description and understanding of disclosed technical matters, and are not intended to limit the scope of the present disclosure. Therefore, it should be construed that the scope of the present disclosure includes any change or other various embodiments based on the technical spirit of the present disclosure.

While embodiments of the present disclosure have been described, it would be obvious to those of ordinary skill in the art that various changes may be made without departing the scope of the present disclosure.

The invention claimed is:

1. An electronic device comprising:
   a housing comprising a first surface facing a first direction, a second surface facing a second direction opposite to the first direction, and a side surface surrounding at least a part of a space between the first surface and the second surface;
   a display device formed on at least one of the first surface and the second surface;
   an opening formed on at least one of the first surface, the second surface, and the side surface;
   a light-emitting module mounted at a rear of the display inside the housing not to be exposed; and
   a guide member arranged between the light-emitting module and the opening inside the housing and configured to provide output of the light-emitting module to outside through the opening,
   wherein the guide member comprises at least one of a reflective member and a light-guiding member to receive light emitted from the light-emitting module and to output the received light to the opening,
   wherein the opening comprises:
      a first opening provided between the housing and the display device; and
      a second opening provided in a side surface of the housing adjacent to the light-emitting module, and
   wherein the guide member is electrically connected with a substrate part of the housing and is configured to reflect the light emitted from the light-emitting module to the first opening or to pass the emitted light therethrough to the second opening, depending on whether power is applied thereto.

2. The electronic device of claim 1, wherein the opening further comprises:
   a third opening provided in a surface of the housing opposing the first opening.

3. The electronic device of claim 1, wherein the guide member further comprises:
   a lens part configured to collect the light emitted from the light-emitting module or to output received light; or
   a guide housing connecting from the opening to the light-emitting module and configured to collect the light emitted from the light-emitting module or to output the received light.

4. An electronic device comprising:
   a housing comprising a first surface facing a first direction, a second surface facing a second direction opposite to the first direction, and a side surface surrounding at least a part of a space between the first surface and the second surface;
   a display device formed on at least one of the first surface and the second surface;
   an opening formed on at least one of the first surface, the second surface, and the side surface;
   an illumination sensor module mounted at a rear of the display inside the housing not to be exposed; and
   a guide member arranged between the illumination sensor module and the opening inside the housing and configured to deliver external light introduced from the opening to the illumination sensor module,
   wherein the guide member comprises at least one of a reflective member reflecting the external light to the illumination sensor module and a light-guiding member,
   wherein the opening comprises:
      a first opening provided between the housing and the display device; and
   a second opening provided in a side surface of the housing adjacent to the illumination sensor module, and
      wherein the guide member is electrically connected with a substrate part of the housing, and is configured to deliver light introduced through the first opening to the illumination sensor module or to deliver light introduced through the second opening to the illumination sensor module, depending on whether power is applied thereto.

5. The electronic device of claim 4, wherein the guide member further comprises:
   a lens part configured to collect the external light or to output the external light to the illumination sensor module; or
   a guide housing connecting from the opening to the illumination sensor module and configured to output the external light to the illumination sensor module.

6. An electronic device comprising:
   a housing comprising a first surface facing a first direction, a second surface facing a second direction opposite to the first direction, and a side surface surrounding at least a part of a space between the first surface and the second surface;
a display device formed on at least one of the first surface and the second surface;
an opening formed on at least one of the first surface, the second surface, and the side surface;
an imaging module mounted by being stacked in a side direction at a rear of the display inside the housing not to be exposed; and
a guide member arranged between the imaging module and the opening inside the housing,
wherein the guide member comprises a reflective member configured to deliver an image of an external object to the imaging module through the opening.

7. The electronic device of claim 6, wherein the opening comprises:
a first opening provided between the housing and the display device; and
a second opening provided in the side surface of the housing adjacent to the imaging module, and
wherein the guide member is electrically connected with a substrate part of the housing, and is configured to deliver the image of the external object introduced through the first opening to the imaging module or to deliver the image of the external object introduced through the second opening to the imaging module, depending on whether power is applied thereto.

8. The electronic device of claim 6, wherein the opening comprises:
a first opening provided between the housing and the display device;
a second opening provided in the side surface of the housing adjacent to the imaging module; and
a third opening provided in a surface of the housing opposing the first opening, and
wherein the guide member is electrically connected with a substrate part of the housing, and is configured to reflect the image of the external object introduced through one of the first opening or the third opening to deliver the image to the imaging module when power is applied thereto, and to deliver the image of the external object introduced through the second opening to the imaging module when the power is not applied thereto.

9. The electronic device of claim 6, wherein the guide member comprises:
a lens part configured to deliver the image of the external object to the imaging module; or
a guide housing connecting from the opening to the imaging module.

10. An electronic device comprising:
a housing comprising a first surface facing a first direction, a second surface facing a second direction opposite to the first direction, and a side surface surrounding at least a part of a space between the first surface and the second surface;
a display device formed on at least one of the first surface and the second surface;
an opening formed on at least one of the first surface, the second surface, and the side surface;
a screen module mounted inside the housing by being connected to the display device to be flexibly bent or by being provided separately from the display device at a rear of the display device;
a guide member arranged between the screen module and the opening inside the housing and configured to provide output of the screen module to outside through the opening;
a first screen region for displaying a first screen through the display device; and
a second screen region for displaying a second screen connected to the first screen region through the screen module,
wherein the guide member is configured to reflect the second screen of the second screen region to output the second screen through the opening, and
wherein the first screen in the first screen region and the second screen in the second screen region are configured to display interconnectedly or separately.

11. The electronic device of claim 10, wherein the guide member comprises at least one of a reflective member and a light-guiding member.

* * * * *